(12) United States Patent
Lee et al.

(10) Patent No.: US 10,573,652 B2
(45) Date of Patent: Feb. 25, 2020

(54) SEMICONDUCTOR DEVICE AND METHOD FOR FABRICATING THE SAME

(71) Applicant: SAMSUNG ELECTRONICS CO., LTD., Suwon-si, Gyeonggi-Do (KR)

(72) Inventors: Myeong-Dong Lee, Seoul (KR); Jun-Won Lee, Asan-si (KR); Ki Seok Lee, Hwaseong-si (KR); Bong-Soo Kim, Yongin-si (KR); Seok Han Park, Hwaseong-si (KR); Sung Hee Han, Hwaseong-si (KR); Yoo Sang Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/945,401

(22) Filed: Apr. 4, 2018

(65) Prior Publication Data

US 2019/0096890 A1 Mar. 28, 2019

(30) Foreign Application Priority Data

Sep. 26, 2017 (KR) .......................... 10-2017-0124256

(51) Int. Cl.
*H01L 27/108* (2006.01)
*H01L 23/532* (2006.01)
(Continued)

(52) U.S. Cl.
CPC ...... *H01L 27/10885* (2013.01); *H01L 23/528* (2013.01); *H01L 23/5226* (2013.01);
(Continued)

(58) Field of Classification Search
CPC ......... H01L 27/10885; H01L 27/10888; H01L 27/10814; H01L 27/10823; H01L 23/53295; H01L 23/528
See application file for complete search history.

(56) References Cited

U.S. PATENT DOCUMENTS 5,602,051 A * 2/1997 Cronin ............. H01L 27/10808
257/E21.648
9,006,078 B2 4/2015 Kim
(Continued)

FOREIGN PATENT DOCUMENTS

JP 2008072106 A 3/2008
KR 20140082281 A 7/2014
(Continued)

*Primary Examiner* — Feifei Yeung Lopez
(74) *Attorney, Agent, or Firm* — Volentine, Whitt & Francos, PLLC

(57) ABSTRACT

A semiconductor device includes a substrate having a trench, a bit line in the trench, a first spacer extending along the trench and at least a portion of a side surface of the bit line and in contact with the bit line, and a second spacer disposed within the trench on the first spacer. The bit line is narrower than the trench, and the first spacer includes silicon oxide. A method of forming a semiconductor device includes forming a trench in a substrate, forming a bit line within the first trench of width less than that of the first trench, and forming a first spacer that lines a portion of the trench and includes silicon oxide in contact with at least a portion of a side surface of the bit line, and forming a second spacer over the first spacer in the trench.

10 Claims, 50 Drawing Sheets

(51) Int. Cl.
*H01L 23/522* (2006.01)
*H01L 23/528* (2006.01)

(52) U.S. Cl.
CPC .. *H01L 23/53295* (2013.01); *H01L 27/10814* (2013.01); *H01L 27/10823* (2013.01); *H01L 27/10855* (2013.01); *H01L 27/10888* (2013.01)

(56) References Cited

U.S. PATENT DOCUMENTS

| | | | |
|---|---|---|---|
| 9,012,321 B1 | 4/2015 | Kim et al. | |
| 9,318,382 B2 | 4/2016 | Kim | |
| 9,520,348 B2 | 12/2016 | Choi et al. | |
| 9,620,451 B2 | 4/2017 | Hwang et al. | |
| 9,627,252 B2 | 4/2017 | Kim | |
| 10,074,656 B1* | 9/2018 | Wang | H01L 27/10885 |
| 2002/0106891 A1* | 8/2002 | Kim | H01L 21/02126 |
| | | | 438/624 |
| 2002/0135072 A1* | 9/2002 | Han | H01L 21/76897 |
| | | | 257/774 |
| 2003/0043622 A1* | 3/2003 | Forbes | G11C 11/404 |
| | | | 365/185.05 |
| 2008/0061340 A1 | 3/2008 | Heineck et al. | |
| 2008/0210999 A1* | 9/2008 | Horikawa | H01L 27/10814 |
| | | | 257/296 |
| 2018/0138183 A1* | 5/2018 | Lin | H01L 21/768 |
| 2018/0301412 A1* | 10/2018 | Borsari | H01L 21/02164 |

FOREIGN PATENT DOCUMENTS

| | | |
|---|---|---|
| KR | 20140124176 | 10/2014 |
| KR | 20150005817 A | 1/2015 |

\* cited by examiner

SEMICONDUCTOR DEVICE AND METHOD FOR FABRICATING THE SAME

PRIORITY STATEMENT

This application claims priority and all the benefits accruing therefrom under 35 U.S.C. 119 from Korean Patent Application No. 10-2017-0124256 filed on Sep. 26, 2017 in the Korean Intellectual Property Office, the contents of which are hereby incorporated by reference in their entirety.

BACKGROUND

1. Technical Field

The present inventive concept relates to a semiconductor device and a method for fabricating the same.

2. Description of the Related Art

Individual circuit patterns are becoming finer in order to increase the degree of integration of semiconductor devices as well as realize more semiconductor devices within the same area.

Meanwhile, in accordance with this trend of semiconductor memory devices becoming more highly integrated, there is a likelihood of increases in parasitic capacitance and leakage current. Parasitic capacitance and leakage current have deleterious effects on the operating characteristics of semiconductor devices, especially semiconductor memory devices and thus, the influences of parasitic capacitance and leakage current on product quality and reliability are gradually increasing. Therefore, a semiconductor device capable of minimizing parasitic capacitance and leakage current is desirable.

SUMMARY

According to an aspect of the present inventive concept, there is provided a semiconductor device comprising a substrate having a trench therein, a bit line in the trench and having a width less than a width of the trench as both taken in a first direction in a horizontal plane, a first spacer lining part of the trench and extending along at least a portion of a side surface of the bit line, and a second spacer on the first spacer, and in which the first spacer includes silicon oxide in contact with the bit line, and the second spacer occupies a region of the trench remaining unfilled by the first spacer.

According to another aspect of the present inventive concept, there is provided a semiconductor device comprising a substrate including a first active region, a first bit line on the first active region, a first spacer extending along at least a portion of a side surface of the first bit line, and a second spacer on the first spacer, and in which the first spacer includes SiOC in contact with the first bit line, and the second spacer includes silicon nitride.

According yet another aspect of the present inventive concept, there is provided a semiconductor device comprising a substrate, a bit line on the substrate and extending in a first direction, a word line in the substrate and extending in a second direction intersecting the first direction, a capping pattern on the word line, the capping pattern extending in the second direction, a trench having a first portion in the capping pattern, a first spacer including a silicon oxide film lining the first portion of the trench, and a second spacer on the first spacer, and in which the second spacer is disposed in a region of the first portion of the trench left unfilled by the first spacer.

BRIEF DESCRIPTION OF THE DRAWINGS

The above and other aspects and features of the present inventive concept will become more apparent from the detail description of examples thereof that follows with reference to the attached drawings, in which:

FIGS. 8 to 46 illustrate a method for fabricating a semiconductor device according to the present inventive concept, wherein FIGS. 8, 11, 14, 17, 20, 25, 40, are layout diagrams of the device during the course of its manufacture, FIG. 9 is a cross-sectional view taken along line A1-A1' of FIG. 8, FIG. 10 is a cross-sectional view taken along line B1-B1' of FIG. 8, FIG. 12 is a cross-sectional view taken along line A2-A2' of FIG. 11, FIG. 13 is a cross-sectional view taken along line B2-B2' of FIG. 11, FIG. 15 is a cross-sectional view taken along line A3-A3' of FIG. 14, FIG. 16 is a cross-sectional view taken along line B3-B3' of FIG. 14, FIG. 18 is a cross-sectional view taken along line A4-A4' of FIG. 17, FIG. 19 is a cross-sectional view taken along line B4-B4' of FIG. 17, FIG. 21 is a cross-sectional view taken along line A5-A5' of FIG. 20, FIG. 22 is a cross-sectional view taken along line B5-B5' of FIG. 20, FIG. 23 is a cross-sectional view taken in the same direction as line A5-A5' of FIG. 20, FIG. 22 is a cross-sectional view taken in the same direction as line B5-B5' of FIG. 20, FIG. 26 is a cross-sectional view taken along line A6-A6' of FIG. 25, FIG. 27 is a cross-sectional view taken along line B6-B6' of FIG. 25, FIGS. 28, 30, 32, 34, 36, and 38 are cross-sectional views each taken in the same direction as line A6-A6' of FIG. 25, FIGS. 29, 31, 33, 35, 37 and 39 are cross-sectional views each taken in the same direction as line B6-B6' of FIG. 25, FIG. 41 is a cross-sectional view taken along line A7-A7' of FIG. 40, FIG. 42 is a cross-sectional view taken along line B7-B7' of FIG. 40, FIGS. 43a, 43b and 43c are each a cross-sectional view taken in the same direction as line A7-A7' of FIG. 40, FIG. 45 is a cross-sectional view taken in the same direction as line A7-A7' of FIG. 40, and FIG. 46 is a cross-sectional view taken in the same direction as line B7-B7' of FIG. 40.

DETAILED DESCRIPTION

Figure 1:
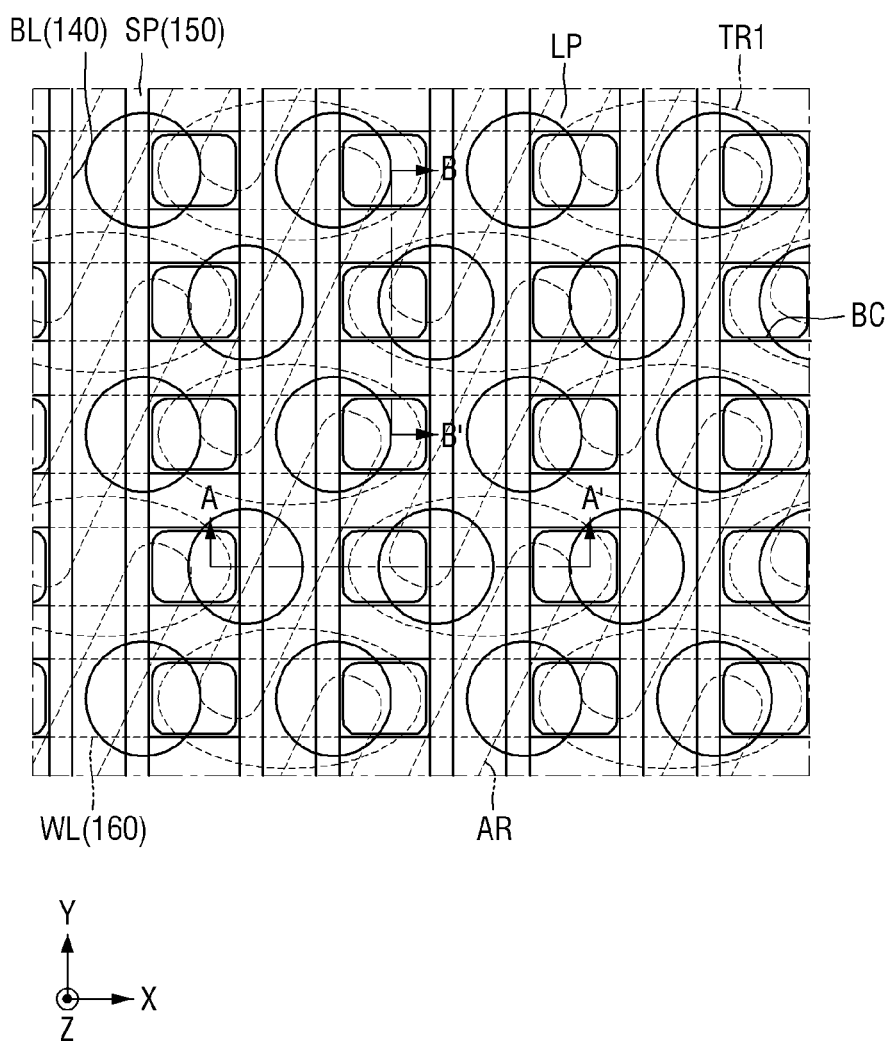
FIG. 1 is a layout diagram illustrating examples of a semiconductor device according to the present inventive concept.

Hereinafter, examples of semiconductor devices according to the present inventive concept will be described with reference to FIGS. 1 to 4.

Referring to FIGS. 1, 2, 3a and 4, examples of the semiconductor device include a substrate 110, a device isolation film 120, an insulating film 130, a first trench TR1, a bit line BL, a spacer structure SP, a word line WL, a direct contact DC, a fence 170, a buried contact BC, a landing pad LP, an interlayer insulating film 180, and a capacitor 190.

The substrate 110 may have a structure in which a base substrate and an epitaxial layer are stacked, but the inventive concept is not limited thereto. The substrate 110 may be a silicon substrate, a gallium arsenide substrate, a silicon germanium substrate, or a semiconductor-on-insulator (SOI) substrate. In the example described in the following, the substrate 110 is a silicon substrate.

The substrate 110 may include an active region AR. To facilitate the implementation of a small design rule, the active region AR of the semiconductor device may be formed in an oblique bar shape, as shown in FIG. 1. For example, the active region AR may be formed in a bar shape extending in an arbitrary direction other than a first direction X and a second direction Y on a plane in which the first direction X and the second direction Y extend. The active region AR may include impurities to form source and drain regions. For example, the central section of the active region AR may be connected to the bit line BL at the direct contact DC. Thus, the central section of the active region AR may form one of the source and drain regions. Further, for example, both ends of the active region AR may be connected to a buried contact BC. Accordingly, one end of the active region AR may form the other of the source and drain regions.

Note, too, in the description above and the description that follows an element or feature may be referred to in the singular for simplicity but it will be clear from the context and drawings that examples of semiconductor device according to the inventive concept may have a plurality of such elements or features and that the description also applies to each element or feature. Thus, the device isolation film 120 may define a plurality of active regions AR. The active regions AR may be in the form of bars extending parallel to each other. In addition, the central section of one of the plurality of active regions AR may be arranged adjacent to the end of another active region AR (in the first direction X, for example).

Figure 2:
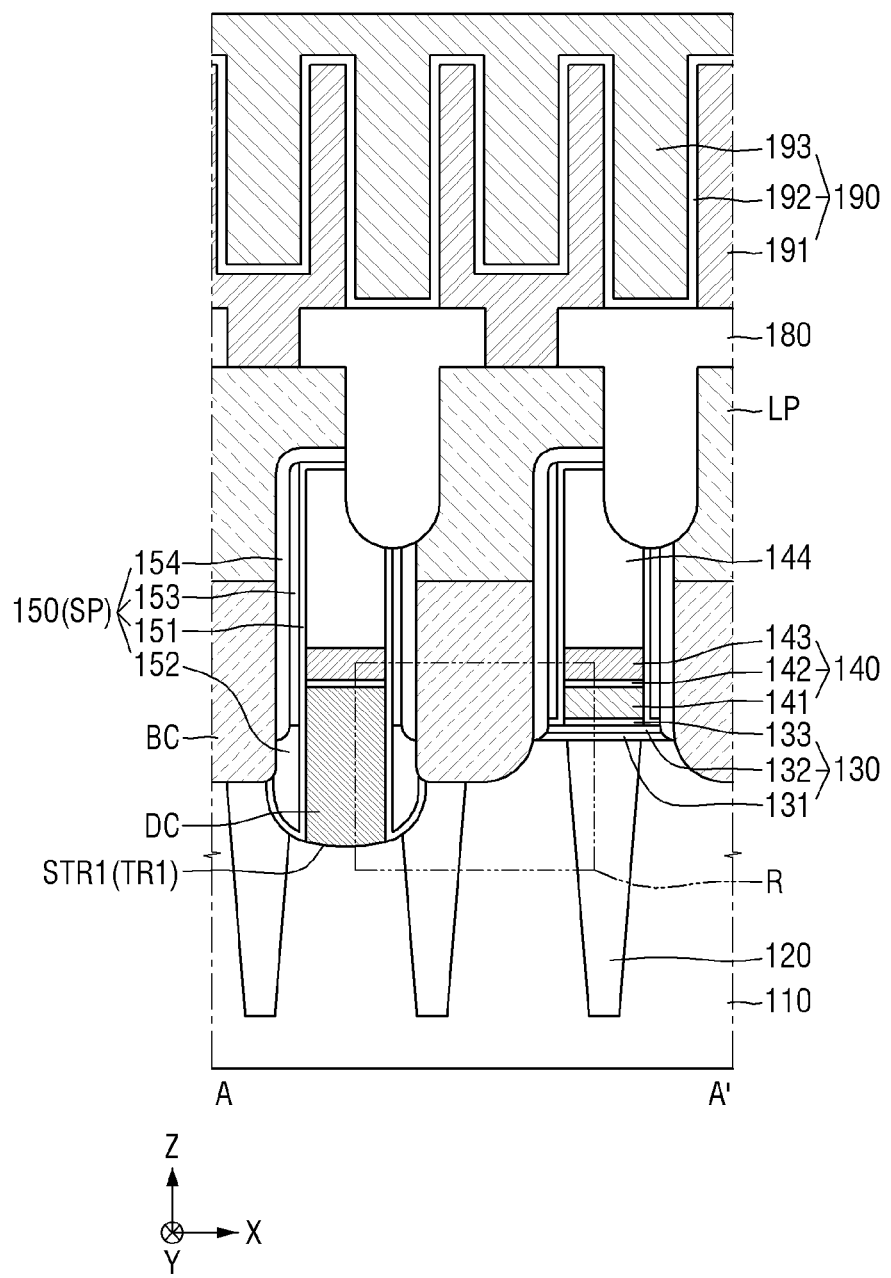
FIG. 2 is a cross-sectional view taken along line A-A' of FIG. 1.
Figure 4:
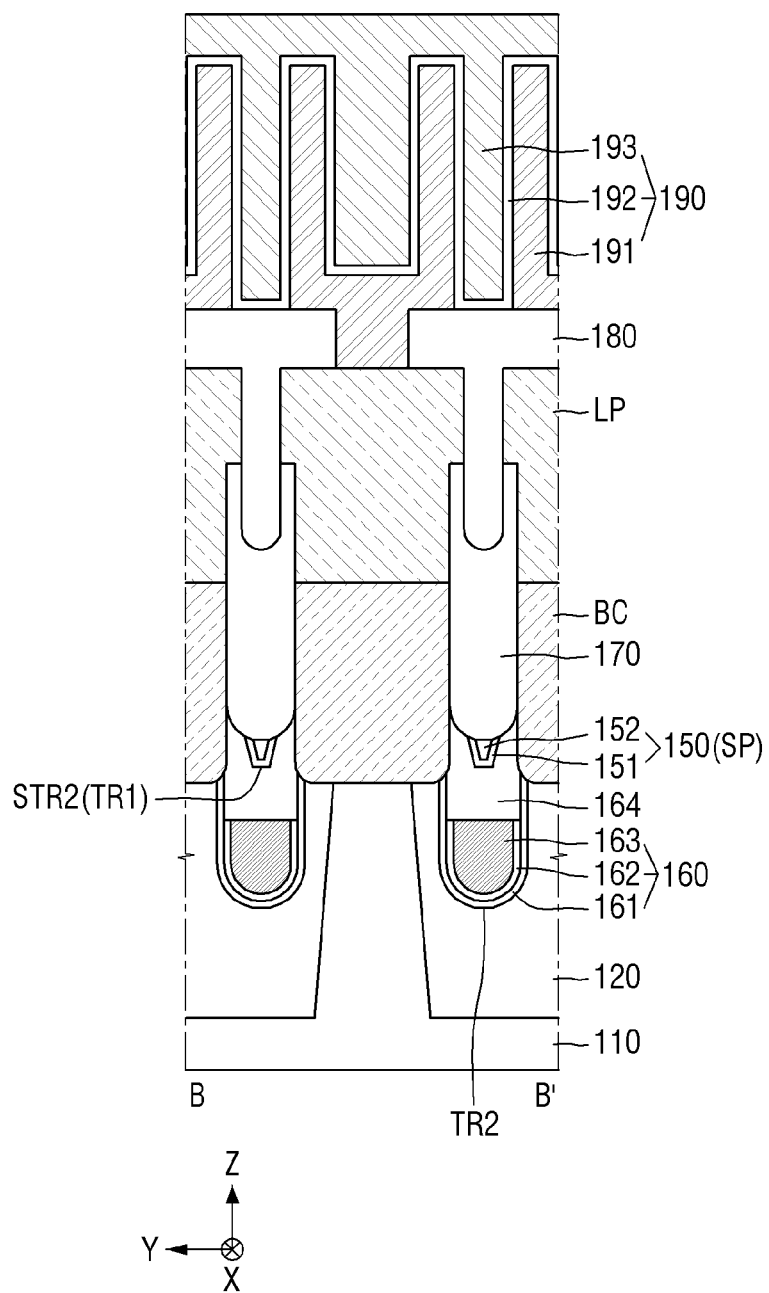
FIG. 4 is a cross-sectional view taken along line B-B' of FIG. 1.

In FIGS. 2 and 4, the sidewalls of the device isolation film 120 are shown as being inclined, but this is feature is dependent on the process of forming the film 120, and the inventive concept is not limited thereto. Here and throughout the description the term "sidewall" will be generally understood as referring to a side or side surface of a particular element or section thereof. In the case of a linear or elongated element, for example, the sidewalls may refer to the opposite side surfaces of the element in the widthwise direction thereof.

The device isolation film 120 may include an oxide film, a nitride film, or a combination thereof, but the inventive concept is not limited thereto. The device isolation film 120 may be a single-layer film made of one kind of insulating material or a multilayer film made of a combination of various kinds of insulating materials.

The first trench TR1 may be formed in the substrate 110. The first trench TR1 may be a trench formed in the substrate 110 to allow the bit line BL to be operatively associated with the active region AR. For example, the direct contact DC may be formed in the first trench TR1.

The first trench TR1 may have a first portion and a second portion referred to hereinafter respectively as a first sub-trench STR1 and a second sub-trench STR2.

The first sub-trench STR1 may be formed around the central section of the active region AR. For example, as shown in FIGS. 1 and 2, the first sub-trench STR1 may be formed in the device isolation film 120 adjacent to a central section of the active region AR. Thus, the first sub-trench STR1 may expose the periphery of the central section of the active region AR.

The second sub-trench STR2 may be formed above the word line 160 (WL in FIG. 1). For example, as shown in FIGS. 1 and 4, the second sub-trench STR2 may be formed in a second capping pattern 164 on the word line 160. The second capping pattern 164 may be referred to simply as a "cap" of insulating material that caps the word line 160. Even more specifically as shown in FIG. 4, the bottom surface of the second capping pattern 164 contacts an upwardly facing surface of the conductive layer 163 and the top of conductive layer 162 to insulate the conductive layers of the word line 160 from the buried contact BC, for example.

The depth of the second sub-trench STR2 may be shallower than the depth of the first sub-trench STR1. However, this is merely a result of the manufacturing process, and the inventive concept is not limited thereto.

In some examples, the first sub-trench STR1 and the second sub-trench STR2 may be contiguous with each other, i.e., may open directly into each other.

The insulating film 130 may be formed on the substrate 110 and the device isolation film 120. Specifically, as shown in FIG. 2, the insulating film 130 may be formed on the substrate 110 and the device isolation film 120 in a region of the substrate 110 where the direct contact DC is not formed.

The insulating film 130 may be a single film. However, as illustrated, the insulating film 130 may be a multilayer film including a first insulating film 131, a second insulating film 132 and a third insulating film 133.

The first insulating film 131 may include, for example, silicon oxide. The second insulating film 132 may include a material having etching selectivity with respect to the first insulating film 131. For example, the second insulating film 132 may include silicon nitride. The third insulating film 133 may include a material having a dielectric constant lower than that of the second insulating film 132. For example, the third insulating film 133 may include silicon oxide.

In some examples, the width of the third insulating film 133 may be substantially equal to the width of the bit line BL. As used herein, the term "substantially equal" means not only being identical but also encompasses equal except for a minute difference that may occur due to a process margin and the like.

The word line 160 (WL in FIG. 1) may be elongated along the first direction X across the active region AR. A plurality of word lines 160 may extend parallel to each other. In addition, the plurality of word lines 160 may be spaced apart from each other at equal intervals.

In some examples, as shown in FIG. 4, the word line 160 may be embedded in the substrate 110. For example, the word line 160 may be formed by forming a second trench TR2 extending in the first direction X in the substrate 110, and sequentially burying a gate dielectric layer 161, a fourth conductive layer 162 and a fifth conductive layer 163 in the second trench TR2. Then, a second capping pattern 164 filling the second trench TR2 may be formed on the gate dielectric layer 161, the fourth conductive layer 162 and the fifth conductive layer 163. Each of the fourth conductive layer 162 and the fifth conductive layer 163 may include metal, polysilicon, or the like, but the inventive concept is not limited thereto.

In FIG. 4, the word line 160 is shown as a multilayer film including the fourth conductive layer 162 and the fifth conductive layer 163, but the word line 160 may be a single film.

The bit line 140 (BL in FIG. 1) may be disposed on the substrate 110 and the insulating film 130. The bit line 140 may extend along the second direction Y different from the first direction X across the active region AR and the word line 160. For example, the second direction Y may be a direction perpendicular to the first direction X. Accordingly, the bit line 140 may obliquely cross the active region AR and vertically cross the word line 160. A plurality of bit lines 140 may extend in parallel to each other. Also, the plurality of bit lines 140 may be spaced apart from each other at equal intervals.

The bit line 140 may be a single film, but the bit line 140 may be, as shown in FIG. 2, a multilayer film including a first conductive layer 141, a second conductive layer 142, a third conductive layer 143 and the direct contact DC.

For example, each of the first conductive layer 141, the second conductive layer 142 and the third conductive layer 143 may include polysilicon, TiN, TiSiN, tungsten, tungsten silicide, or a combination thereof. For example, the first conductive layer 141 may include polysilicon, the second conductive layer 142 may include TiSiN, and the third conductive layer 143 may include tungsten, but the inventive concept is not limited thereto.

The direct contact DC may be formed in the first sub-trench STR1. In addition, the direct contact DC may be in contact with the substrate 110. For example, the direct contact DC may be in contact with the central section of the active region AR exposed by the first sub-trench STR1. The active region AR of the substrate 110 in contact with the direct contact DC may function as source and drain regions.

The remaining portion of the bit line 140 where the direct contact DC is not formed may be formed on the insulating film 130.

The direct contact DC may include a conductive material. Accordingly, a portion of the bit line 140 may be electrically connected to the active region AR.

In some examples, the direct contact DC may include the same material as the first conductive layer 141. For example, the direct contact DC may include polysilicon. However, the inventive concept is not limited thereto, and the direct contact DC may include a material different from the first conductive layer 141 according to the manufacturing process.

The bit line 140 may have a first capping pattern 144 thereon. The first capping pattern 144 may include a silicon nitride film, but the inventive concept is not limited thereto.

The bit line 140 may have first and second portions referred to hereinafter as a first bit line 140a and a second bit line 140b, respectively.

The first bit line 140a is a portion of the bit line 140 in contact with the active region AR. The second bit line 140b is a portion of the bit line 140 which is not in contact with the active region AR. That is, as shown in FIG. 2, the first bit line 140a may be a portion of the bit line 140 including the direct contact DC, and the second bit line 140b may be a portion of the bit line 140 that does not include the direct contact DC.

In some examples, the first bit line 140a may not include the first conductive layer 141. For example, the first conductive layer 141 of the second bit line 140b may be replaced by the direct contact DC in the first bit line 140a. However, the inventive concept is not limited thereto, and the direct contact DC of the first bit line 140a may be formed below the first conductive layer 141.

In some examples, the width of the bit line 140 may be smaller than the width of the first sub-trench STR1. The width of the bit line 140 and the first sub-trench STR1 refers to the dimensions thereof in the first direction X intersecting the second direction Y in which the bit line 140 extends. For example, as shown in FIG. 2, the width of the bit line 140 may be less than the width of the first sub-trench STR1. Accordingly, a portion of the bit line 140 can be formed in the first sub-trench STR1. For example, as shown in FIG. 2, the width of the bit line 140 may be smaller than the width of the first sub-trench STR1. Accordingly, a portion of the bit line 140 may be formed in the first sub-trench STR1. Note, here and throughout the description, the term "extends" will be generally understood as referring to a longitudinal direction in the case of a line-shaped or elongated element or feature or will be understood as referring to the vertical direction as the context and figures will make clear.

A spacer structure 150 (SP in FIG. 1) may be disposed on the sidewall of the bit line 140. Further, the spacer structure 150 may be elongated in the second direction Y.

The spacer structure 150 may be in contact with the substrate 110 and the device isolation film 120 in a portion of the bit line 140 where the direct contact DC is formed. However, in the remaining portion of the bit line 140 where the direct contact DC is not formed, the spacer structure 150 may be in contact with insulating film 130. For example, the spacer structure 150 may be in contact with the substrate 110 and the device isolation film 120 on the sidewall of the first bit line 140a and may be in contact with the insulating film 130 on the sidewall of the second bit line 140b.

The spacer structure 150 may include a first spacer 151, a second spacer 152, a third spacer 153 and a fourth spacer 154.

The first spacer 151 may extend along at least a portion of the sidewall of the bit line 140 and line the first trench TR1 (specifically, the part of the first trench TR1 not contacted by the direct contact DC of the bit line 140). Also, the first spacer 151 may be in contact with the bit line 140.

For example, the first spacer 151 may extend along at least a portion of the sidewall of the first bit line 140a and a profile of the first trench TR1. In this case, the material of the first spacer 151 may be in contact with at least a portion of the sidewall of the first bit line 140a, the substrate 110 and the device isolation film 120.

Figure 3A:
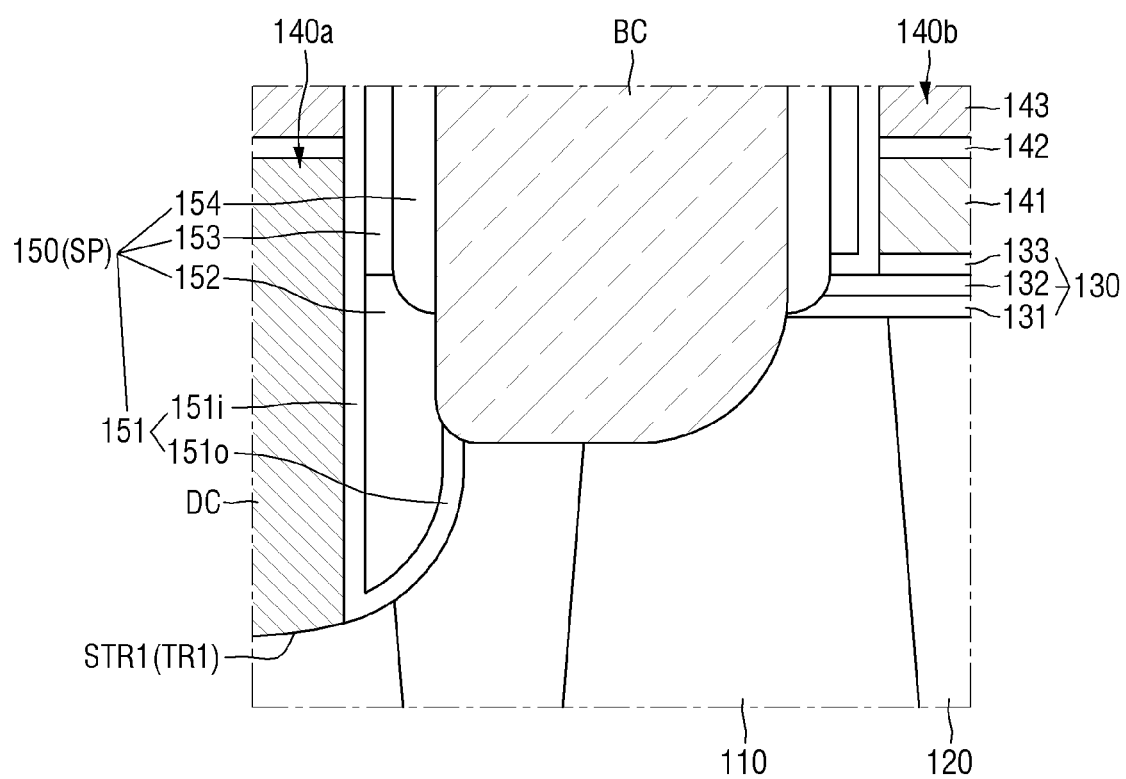
FIGS. 3a, 3b, 3c, 3d, 3e and 3f are enlarged views, respectively, of various versions of region R of FIG. 2 according to the present inventive concept.
Figure 3B:
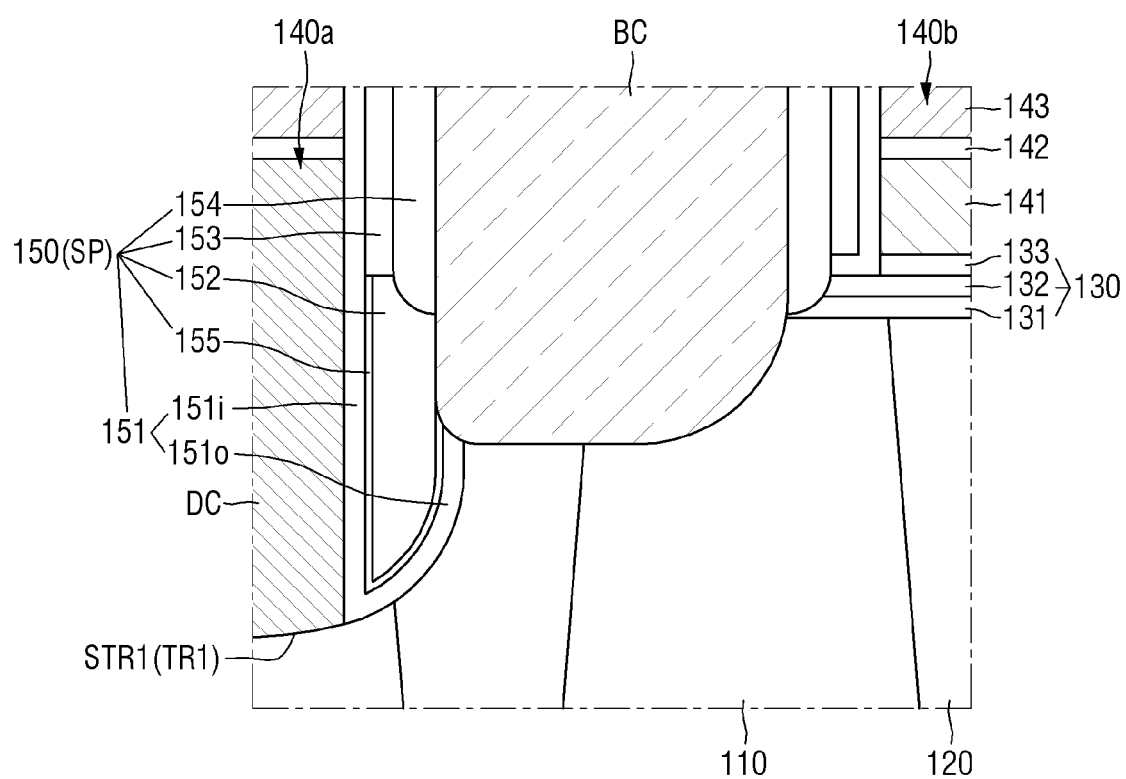

As shown in FIG. 3a, the first spacer 151 may include an inner portion 151i and an outer portion 151o. The inner portion 151i of the first spacer 151 is a portion of the first spacer 151 which contacts at least a portion of the sidewall of the first bit line 140a and extends along at least a portion of the sidewall of the first bit line 140a. The outer portion 151o of the first spacer 151 is a portion of the first spacer 151 which contacts the substrate 110 and the device isolation film 120 and extends along a profile of, i.e., lines part of, the first trench TR1.

Although FIG. 2 illustrates that the first spacer 151 is in contact with the central section of the active region AR and the device isolation film 120 adjacent to the central section of the active region AR, the inventive concept is not limited thereto. For example, due to a misalignment that may occur in the process of forming the first sub-trench STR1, the first spacer 151 may be in contact with another adjacent active region AR. For example, the first sub-trench STR1 may be formed in one active region AR in contact with the direct contact DC and in another active region AR in contact with the buried contact BC. Thus, in some examples, the outer portion 1510 of the first spacer 151 may contact the active region AR in contact with the buried contact BC.

Also, for example, the first spacer 151 may extend along at least a portion of the sidewall of the second bit line 140b. In this case, the first spacer 151 may contact at least a portion of the sidewall of the second bit line 140b.

Also, the first spacer 151 may extend on the insulating film 130. For example, the first spacer 151 may extend along the upper surface of the second insulating film 132 from the sidewall of the second bit line 140b.

Also, as shown in FIG. 4, the first spacer 151 may be formed on the word line 160. Because the first spacer 151 extends along the first trench TR1, the first spacer 151 may extend along the second sub-trench STR2 on the word line 160. Accordingly, the first spacer 151 may be formed in the second capping pattern 164 on the word line 160.

The first spacer 151 may include silicon oxide. In some examples, the first spacer 151 may include a material resistant to a wet etching process. For example, the first spacer 151 may include a material resistant to a wet etching process using hydrogen fluoride (HF) or phosphoric acid ($H_3PO_4$). The first spacer 151 may include, for example, carbon-doped silicon oxide (SiOC).

The second spacer 152 may be formed on the first spacer 151. Also, the second spacer 152 may fill the first trench TR1.

In some examples, the uppermost surface of the second spacer 152 may be disposed substantially on the same plane as the upper surface of the first spacer 151 on the second insulating film 132.

Also, as shown in FIG. 4, the second spacer 152 may be formed on the word line 160. Because the second spacer 152 fills the second trench TR2, the second spacer 152 may fill the second sub-trench STR2 on the word line 160. Thus, the second spacer 152 may be formed in the second capping pattern 164 on the word line 160.

The second spacer 152 may include a material resistant to a wet etching process. For example, the first spacer 151 may include a material resistant to a wet etching process using hydrogen fluoride (HF) or phosphoric acid ($H_3PO_4$). The second spacer 152 may include, for example, silicon nitride.

The third spacer 153 may be formed on the first spacer 151 and the second spacer 152. Also, the third spacer 153 may extend along the sidewall of bit line 140. For example, the third spacer 153 may be formed on the sidewall of the first spacer 151 and on the upper surface of the second spacer 152. The third spacer 153 may be elongated in the second direction Y.

The third spacer 153 may include a material having a lower dielectric constant than silicon nitride. For example, the third spacer 153 may include silicon oxide. However, the inventive concept is not limited thereto, and the third spacer 153 may include a silicon germanium compound or a polymer.

The fourth spacer 154 may be formed on the second spacer 152 and the third spacer 153. Also, the fourth spacer 154 may extend along the sidewall of bit line 140. For example, the fourth spacer 154 may be formed on the upper surface of the second spacer 152 and on the sidewall of the third spacer 153. The fourth spacer 154 may be elongated in the second direction Y.

In some examples, the fourth spacer 154 may be formed to fill the trench in the second spacer 152 and the third spacer 153. This will be described later in detail with reference to FIGS. 30 to 33.

Although FIG. 3A illustrates that the fourth spacer 154 does not contact the first spacer 151, the inventive concept is not limited thereto. For example, the fourth spacer 154 may contact all of the first spacer 151, the second spacer 152 and the third spacer 153.

The fourth spacer 154 may include, for example, silicon nitride.

The fence 170 may be formed on the word line 160. Similarly to the word line 160, the fence 170 may extend in the first direction X. The fence 170 may support the buried contact BC formed between the word lines 160.

The fence 170 may include, for example, silicon nitride, but the inventive concept is not limited thereto.

The buried contact BC may be disposed on the substrate 110 between the bit lines 140. For example, as shown in FIG. 1, the buried contact BC may be disposed in a region defined by the word line 160 and the bit line 140. Further, the buried contact BC may form a plurality of isolated regions which are spaced apart from each other.

In some examples, the buried contact BC may be disposed in a region defined by the fourth spacer 154 and the fence 170.

The buried contact BC may contact the substrate 110. For example, the buried contact BC may contact the end of the active region AR of FIG. 1. The active region AR of the substrate 110 in contact with the buried contact BC may function as source and drain regions.

In some examples, the buried contact BC may be formed to fill the fourth spacer 154 and the trench in the substrate 110. In some examples, the buried contact BC may be in contact with the first spacer 151. For example, as shown in FIG. 3A, the buried contact BC may contact the outer portion 1510 of the first spacer 151. This will be described later in detail with reference to FIGS. 38 to 42.

The buried contact BC may include a conductive material. Thus, the buried contact BC may be electrically connected to the active region AR. The buried contact may include, for example, polysilicon, but the inventive concept is not limited thereto.

The landing pad LP may be disposed on a portion of the upper surface of the bit line 140 and on the upper surface of the buried contact BC. Further, the landing pad LP may contact the buried contact BC. Similarly to the buried contact BC, the landing pad LP may form a plurality of isolated regions which are spaced apart from each other.

The landing pad LP may include a conductive material and may be electrically connected to the buried contact BC. For example, the landing pad LP may include tungsten (W), but the inventive concept is not limited thereto.

The interlayer insulating film 180 may be formed on a portion of the upper surface of the landing pad LP and a portion of the bit line 140. Furthermore, the interlayer insulating film 180 may define a region of the landing pad LP which forms a plurality of isolated regions. That is, the interlayer insulating film 180 may separate landing pads LP from each other. Further, the interlayer insulating film 180 may be patterned to expose a portion of the upper surface of each landing pad LP.

The interlayer insulating film 180 may include an insulating material to electrically isolate landing pads LP from each other. For example, the interlayer insulating film 180 may include silicon oxide, but the inventive concept is not limited thereto.

The capacitor 190 may be disposed on the interlayer insulating film 180 and the landing pad LP. The capacitor 190 may be connected to a portion of the upper surface of the landing pad LP exposed by the interlayer insulating film 180. As a result, the capacitor 190 may be electrically connected to the source and drain regions connected to buried contacts BC. Thus, the capacitor 190 may store charges in a semiconductor memory device or the like.

For example, as shown in FIGS. 2 and 4, the capacitor 190 may include a lower electrode 191, a capacitance dielectric film 192 and an upper electrode 193. The capacitor 190 may store charges in the capacitance dielectric film 192 by a potential difference generated between the lower electrode 191 and the upper electrode 193.

The lower electrode 191 and the upper electrode 193 may include, for example, doped polysilicon, metal, or metal nitride. Furthermore, the capacitance dielectric film 192 may include, for example, silicon oxide or a high dielectric constant material.

As mentioned in the background section, as semiconductor devices become more highly integrated, parasitic capacitance and the leakage current have an increasingly greater effect on device performance and reliability. For example, as pertains to semiconductor devices of a type according to the inventive concept, as the distance between adjacent bit lines of a dynamic random access memory (DRAM) decreases, the parasitic capacitance between the bit lines and between one of the bit lines and the buried contact could increase.

However, a semiconductor device according to the inventive concept can minimize such parasitic capacitance by using silicon oxide. In particular, the some semiconductor devices according to the inventive concept include the first spacer 151 in contact with the bit line 140 and the first spacer 151 includes silicon oxide. Accordingly, in such semiconductor devices according to the inventive concept, the amount of silicon oxide between the bit line 140 and the buried contact BC is maximized.

Because silicon oxide has a lower dielectric constant than silicon nitride, the semiconductor devices according to the inventive concept can effectively reduce the parasitic capacitance. For example, as compared to a semiconductor device in which a spacer in contact with the bit line 140 is formed of silicon nitride, the semiconductor device according to the inventive concept can effectively reduce the parasitic capacitance. Accordingly, a highly integrated semiconductor device with a permissible amount of parasitic capacitance can be realized.

Furthermore, the inventive concept can improve the process margin. When the spacer in contact with the bit line 140 is formed of silicon nitride, there is a problem that silicon nitride is in contact with a depletion region of the substrate 110 to form an interface trap $N_{it}$. This interface trap causes an increase in leakage current. However, a semiconductor device according to the inventive concept can minimize the leakage current even if the first spacer 151 is in contact with the depletion region by forming the first spacer 151 of silicon oxide. This is because silicon oxide can prevent leakage current caused by an interface trap $N_{it}$ more effectively than silicon nitride.

Referring to FIGS. 1, 2, 3*b* and 4, in examples of semiconductor devices according to the inventive concept, the spacer structure 150 further includes a fifth spacer 155. For the sake of brevity, portions of the present examples similar to those described with reference to FIGS. 1, 2, 3*a* and 4 will be briefly described or not described again.

The fifth spacer 155 may be interposed between the first spacer 151 and the second spacer 152. The fifth spacer 155 may extend, on the first spacer 151, along at least a portion of the sidewall of the first bit line 140*a* and the profile of the first trench TR1. That is, the fifth spacer 155 may extend along the profile of the first spacer 151 on the first bit line 140*a*. However, the fifth spacer 155 may not be formed on the second bit line 140*b*.

The uppermost surface of the fifth spacer 155 may be disposed substantially on the same plane as the uppermost surface of the second spacer 152. Accordingly, the third spacer 153 may be formed on the sidewall of the first spacer 151, the upper surface of the second spacer 152 and the upper surface of the fifth spacer 155.

Referring to FIGS. 1, 2, 3*c* and 4, in examples of semiconductor devices according to the inventive concept, the upper surface of the inner portion 151*i* of the first spacer 151 may be disposed at a level lower than or equal to the upper surface of the second spacer 152. For the sake of brevity, portions of the present examples similar to those described with reference to FIGS. 1, 2, 3*a* and 4 will be briefly described or not described again.

Figure 3C:
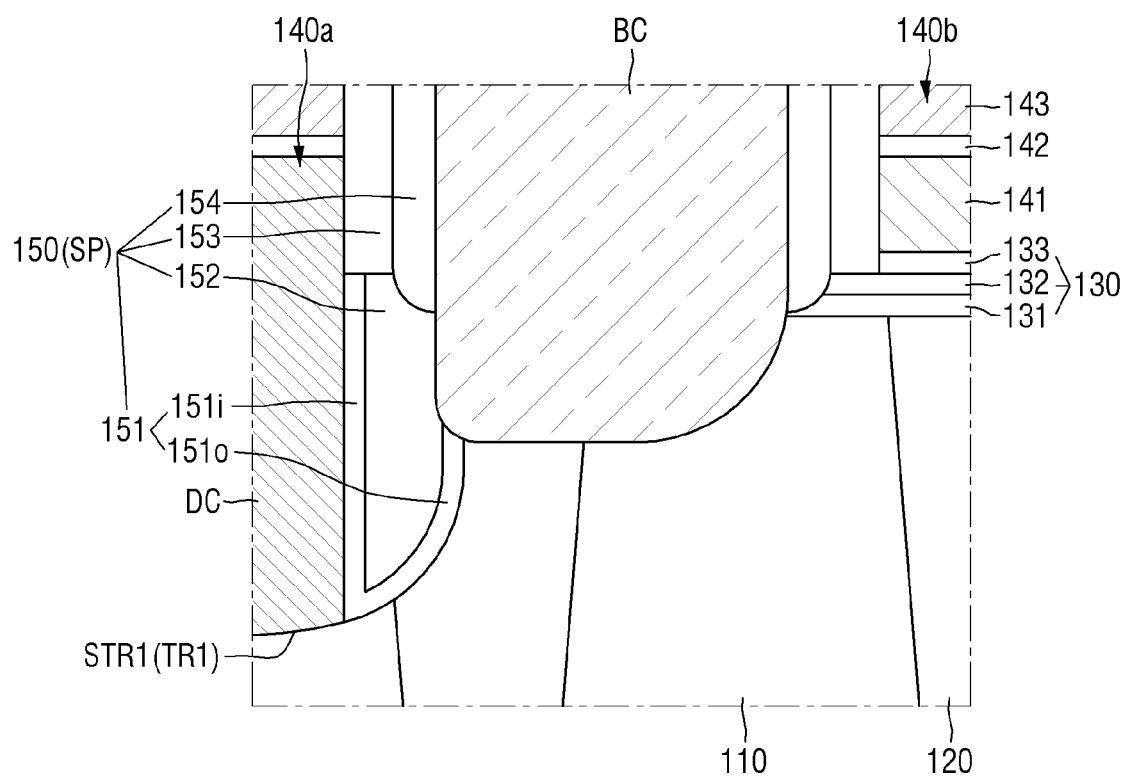

Although FIG. 3*c* illustrates that the upper surface of the inner portion 151*i* of the first spacer 151 is disposed on the same plane as the upper surface of the second spacer 152, the upper surface of the inner portion 151*i* of the first spacer 151 may be lower than that. Accordingly, the third spacer 153 may be formed on the upper surface of the first spacer 151 and the upper surface of the second spacer 152.

In some examples, the first spacer 151 may not be formed on the second bit line 140*b*.

Referring to FIGS. 1, 2, 3*d* and 4, in examples of semiconductor devices according to the inventive concept, the spacer structure 150 includes an air spacer 153A and a sixth spacer 156. For the sake of brevity, portions of the present examples similar to those described with reference to FIGS. 1, 2, 3*a* and 4 will be briefly described or not described again.

The air spacer 153A may correspond to the region occupied by the third spacer 153 in the example of FIG. 3*a*. That is, the air spacer 153A may be an empty space (i.e., an air space) formed in a region from which the third spacer 153 of FIG. 3*a* is removed. This will be described later in detail with reference to FIG. 43*a*.

The sixth spacer 156 may be formed along the outer periphery of the air spacer 153A. For example, the sixth spacer 156 may be formed on the sidewall of the first spacer 151, the upper surface of the second spacer 152, and the sidewall of the fourth spacer 154.

Because the air spacer 153A has a smaller dielectric constant than silicon oxide, theses examples semiconductor device are especially effective at minimizing the parasitic capacitance.

Referring to FIGS. 1, 2, 3*e* and 4, in examples of semiconductor devices according to the inventive concept, the upper surface of the inner portion 151*i* of the first spacer 151 may be disposed at a level lower than or equal to the upper surface of the second spacer 152. For the sake of brevity, portions of the present examples similar to those described with reference to FIGS. 1, 2, 3*d* and 4 will be briefly described or not described again.

The air spacer 153A may be formed in a region occupied by the first spacer 151 and the third spacer 153 in the example of FIG. 3*a*. That is, the air spacer 153A may be an empty space formed in a region where a portion of the first spacer 151 and the third spacer 153 of FIG. 3*a* are removed. Accordingly, the air spacer 153A may be formed on the upper surface of the first spacer 151 and on the upper surface of the second spacer 152. This will be described later in detail with reference to FIG. 43*c*.

Referring to FIGS. 1, 2, 3*f* and 4, in examples of semiconductor devices according to the inventive concept, the width of the third insulating film 133 may be smaller than the width of the bit line 140. For the sake of brevity, portions of the present examples similar to those described with reference to FIGS. 1, 2, 3e and 4 will be briefly described or not described again.

For example, the width W2 of the third insulating film 133 may be smaller than the width W1 of the second bit line 140b. This may be caused by a process of removing a portion of the first spacer 151 to form the air spacer 153A. This will be described later in detail with reference to FIG. 43c.

In some examples, the upper surface of the inner portion 151i of the first spacer 151 may be disposed lower than the upper surface of the second spacer 152.

Figure 5:
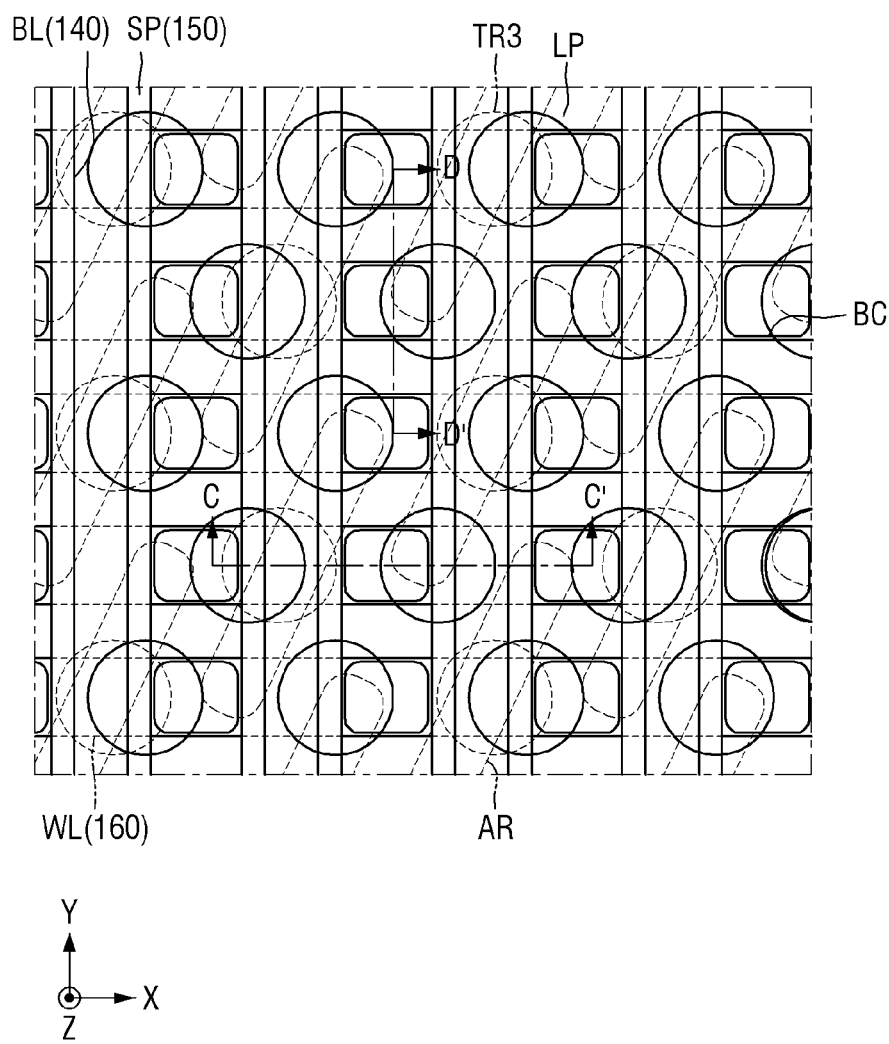
FIG. 5 is a layout diagram illustrating examples of a semiconductor device according to the present inventive concept.
Figure 6:
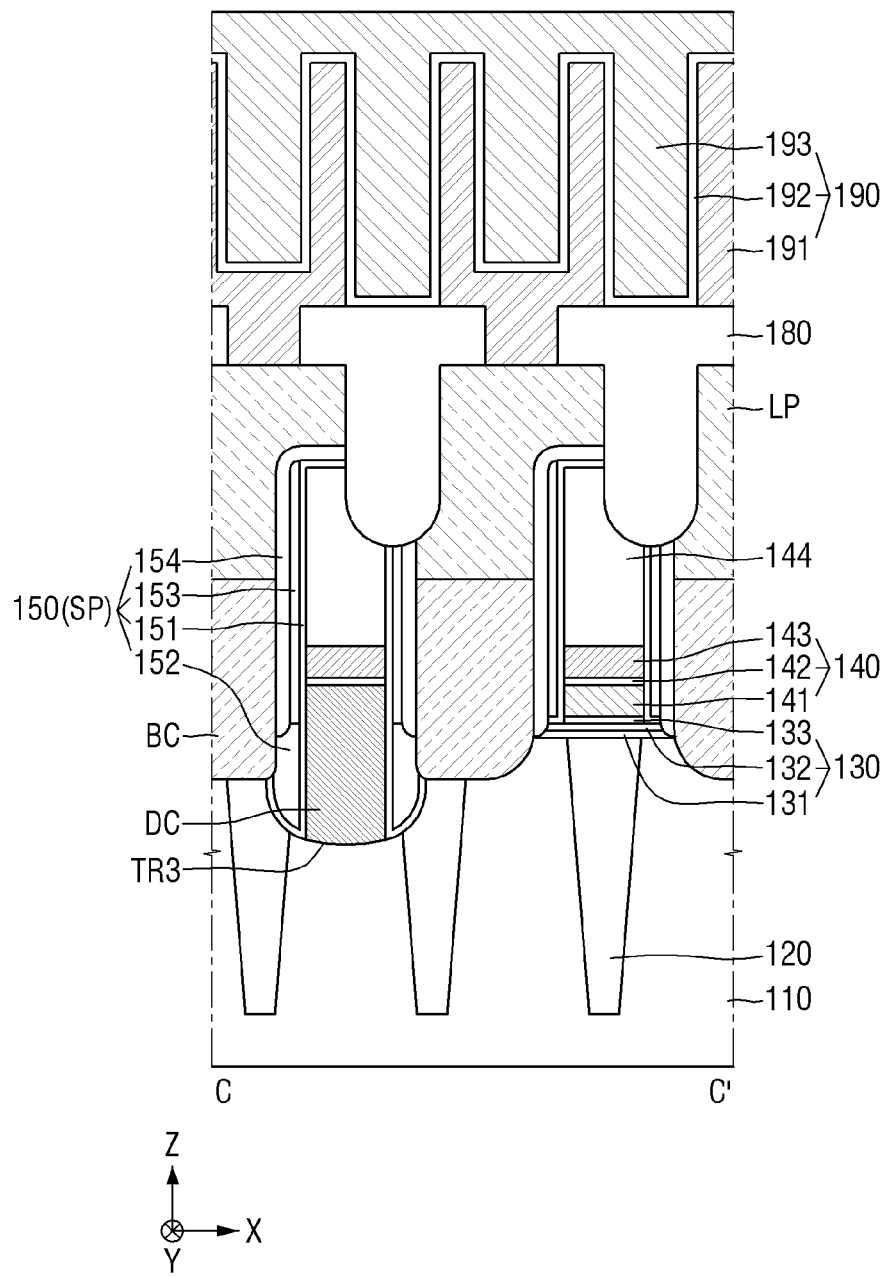
FIG. 6 is a cross-sectional view taken along line C-C' of FIG. 5.
Figure 7:
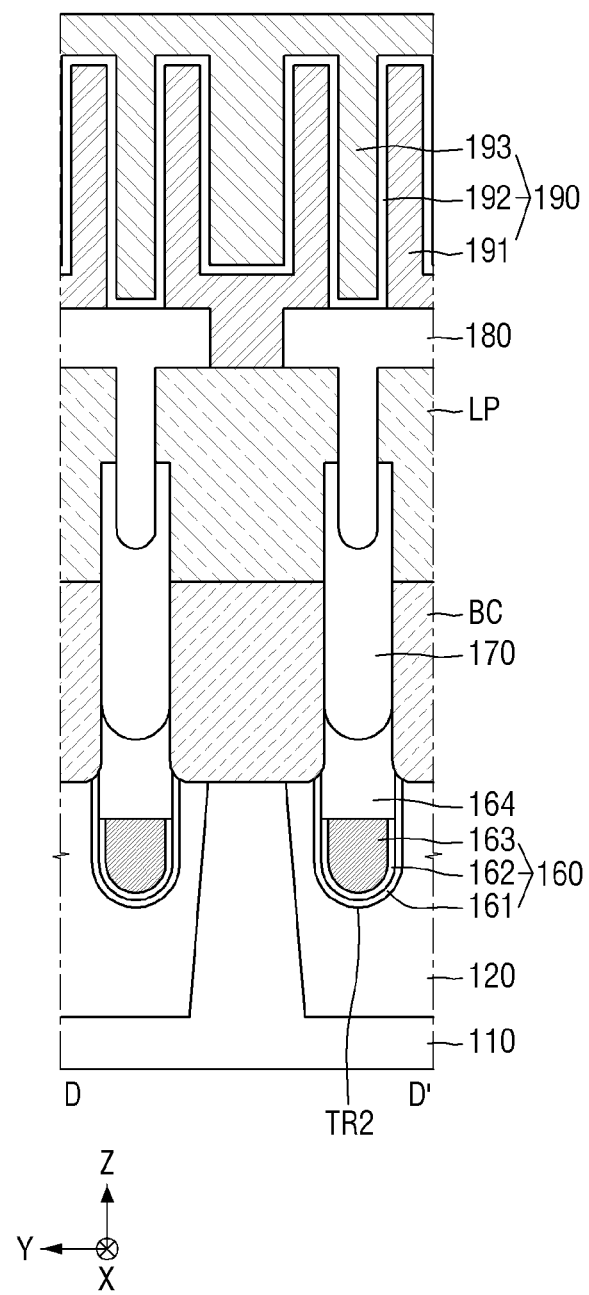
FIG. 7 is a cross-sectional view taken along line D-D' of FIG. 5.

FIG. 5 is a layout diagram of other examples of a semiconductor device according to the present inventive concept. FIG. 6 is a cross-sectional view taken along line C-C' of FIG. 5. FIG. 7 is a cross-sectional view taken along line D-D' of FIG. 5.

Referring to FIGS. 5 to 7, the present examples of a semiconductor device according to the inventive concept include a third trench TR3. In comparison with the examples of a semiconductor device of FIGS. 1 to 4, examples of a semiconductor device of FIGS. 5 to 7 are substantially the same except that the third trench TR3 is formed instead of the first trench TR1. Therefore, mainly only the differences between the examples of FIGS. 1 to 4 and the examples of FIGS. 5 to 7 will be described.

The third trench TR3 may be formed in the substrate 110. The third trench TR3 may be a trench formed in the substrate 110 to allow the bit line 140 to contact the active region AR. For example, the direct contact DC may be formed in the third trench TR3.

The third trench TR3 may be formed around the central section of the active region AR. For example, as shown in FIGS. 5 and 6, the third trench TR3 may be formed in the device isolation film 120 adjacent to the central section of the active region AR and the central section of the active region AR. Thus, the third trench TR3 may expose the periphery of the central section of the active region AR.

However, unlike the first trench TR1 of the examples of FIGS. 1 to 4, the third trench TR3 is not formed on the word line 160. For example, as shown in FIG. 5, the third trench TR3 may be formed in a circle around the central section of the active region AR. Accordingly, unlike the examples of a semiconductor device of FIGS. 1 to 4, the first spacer 151 and the second spacer 152 are not be formed on the word line 160.

Hereinafter, examples of a method of fabricating a semiconductor device according to the present inventive concept will be described with reference to FIGS. 1 to 46. For the sake of brevity, features and aspects similar to those already described with reference to FIGS. 1 to 7 will be briefly explained or not described again.

Figure 8:
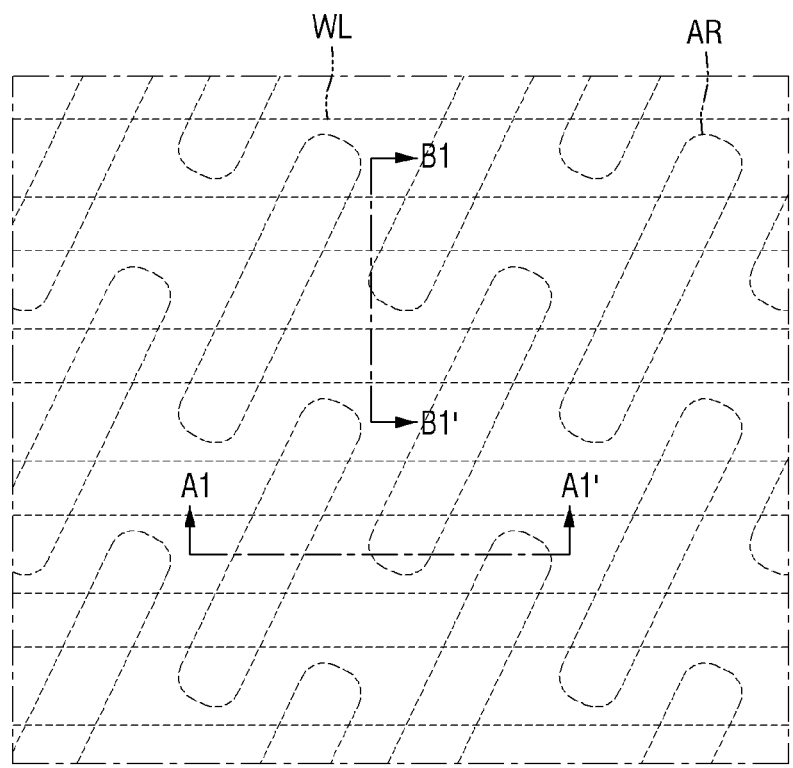
Figure 9:
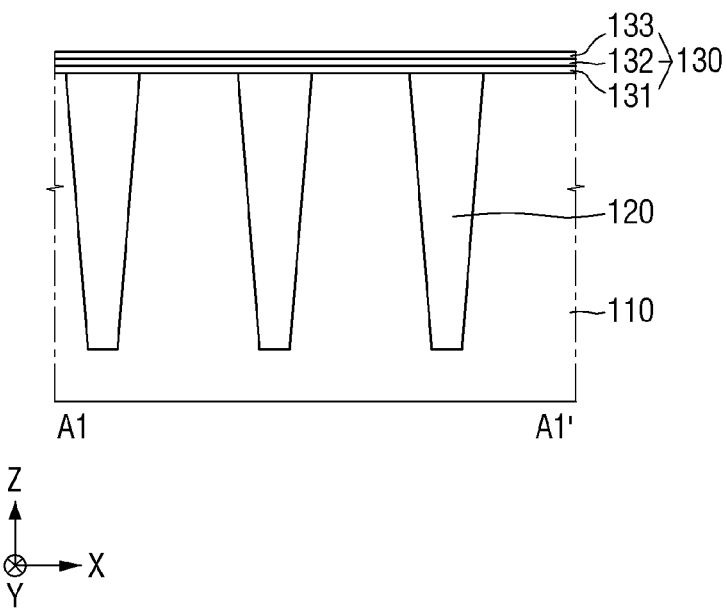
Figure 10:
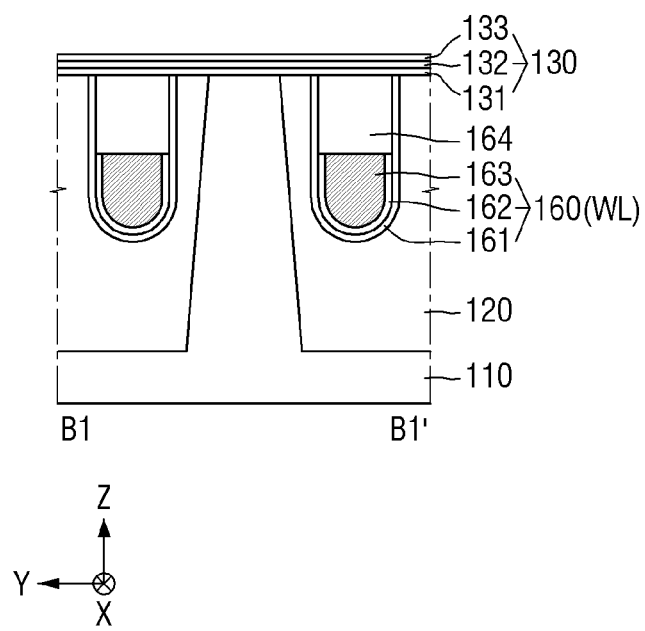

Referring to FIGS. 8 to 10, a substrate 110, a device isolation film 120, a word line 160, and an insulating film 130 are provided. For reference, FIG. 9 is a cross-sectional view taken along line A1-A1' of FIG. 8, and FIG. 10 is a cross-sectional view taken along line B1-B1' of FIG. 8.

The substrate 110 may include an active region AR. As shown in FIG. 8, the active region AR may be formed in an oblique bar shape. The active region AR may be formed by implanting impurities into the substrate 110. In this case, the impurity implantation may be performed by an ion implantation process, but the inventive concept is not limited thereto.

The device isolation film 120 may be formed on the substrate 110. The device isolation film 120 may define a plurality of active regions AR.

The word line 160 may be formed as buried in the substrate 110.

The insulating film 130 may be formed on the substrate 110, the device isolation film 120 and the word line 160. For example, a first insulating film 131, a second insulating film 132 and a third insulating film 133 may be sequentially stacked on the substrate 110, the device isolation film 120 and the word line 160.

Figure 11:
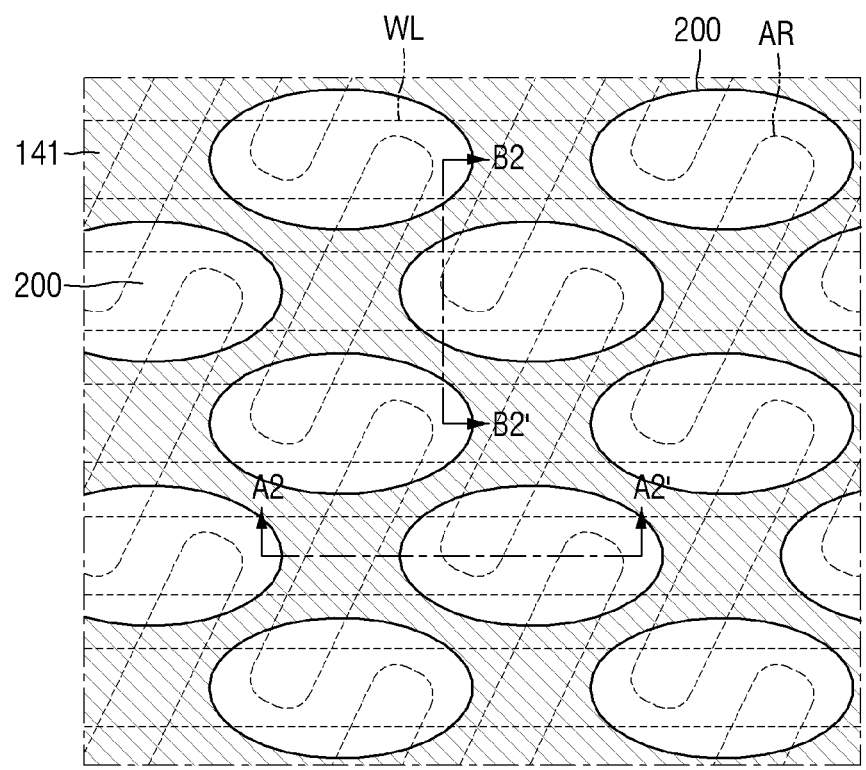
Figure 12:
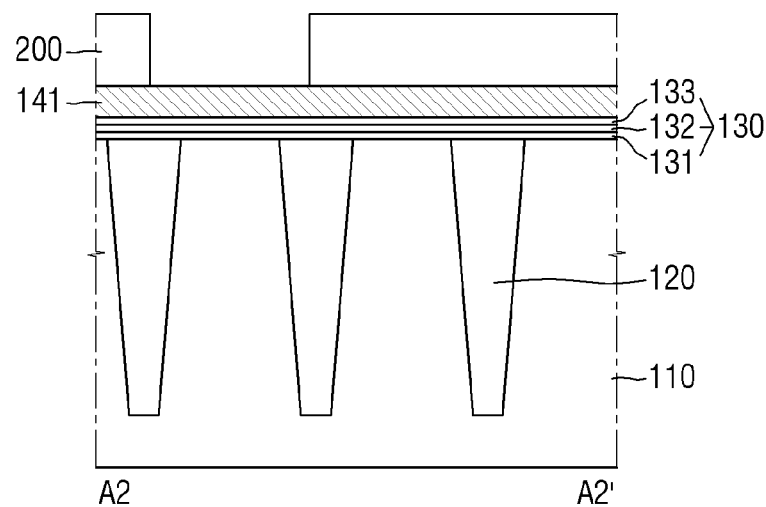
Figure 12:
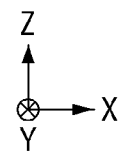
Figure 13:
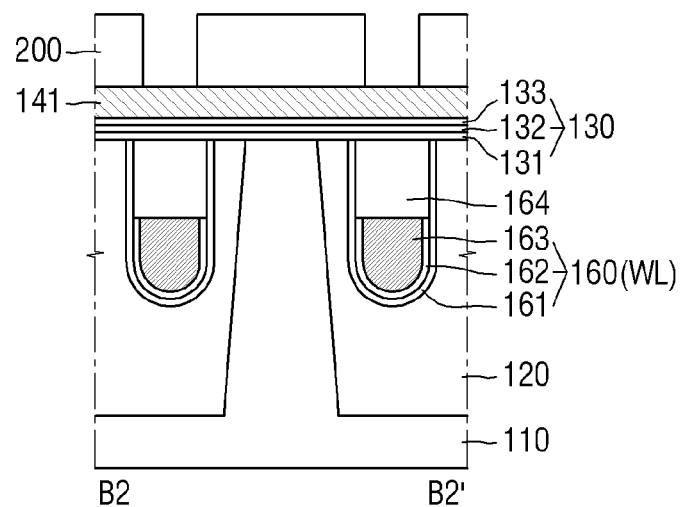
Figure 13:
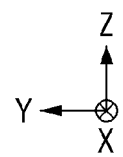

Referring to FIGS. 11 to 13, a first conductive layer 141 is formed on the insulating film 130, and a mask film 200 is formed on the first conductive layer 141. For reference, FIG. 12 is a cross-sectional view taken along line A2-A2' of FIG. 11, and FIG. 13 is a cross-sectional view taken along line B2-B2' of FIG. 11.

The first conductive layer 141 may be formed on the insulating film 130. For example, the first conductive layer 141 may be formed to cover the third insulating film 133.

The mask film 200 may be formed on the first conductive layer 141 to expose the periphery of the central portion of the active region AR. For example, as shown in FIGS. 11 to 13, the mask film 200 may be formed to expose the device isolation film 120 adjacent to the central section of the active region AR and the central section of the active region AR. In addition, the mask film 200 may be formed to expose a portion of the word line 160.

Although FIG. 11 illustrates that each portion of the mask film 200 has an elliptical shape, the inventive concept is not limited thereto. For example, each portion of the mask film 200 may have a circular shape, or may have a polygonal shape such as a rectangular shape.

The mask film 200 may include silicon oxide, but the inventive concept is not limited thereto.

Figure 14:
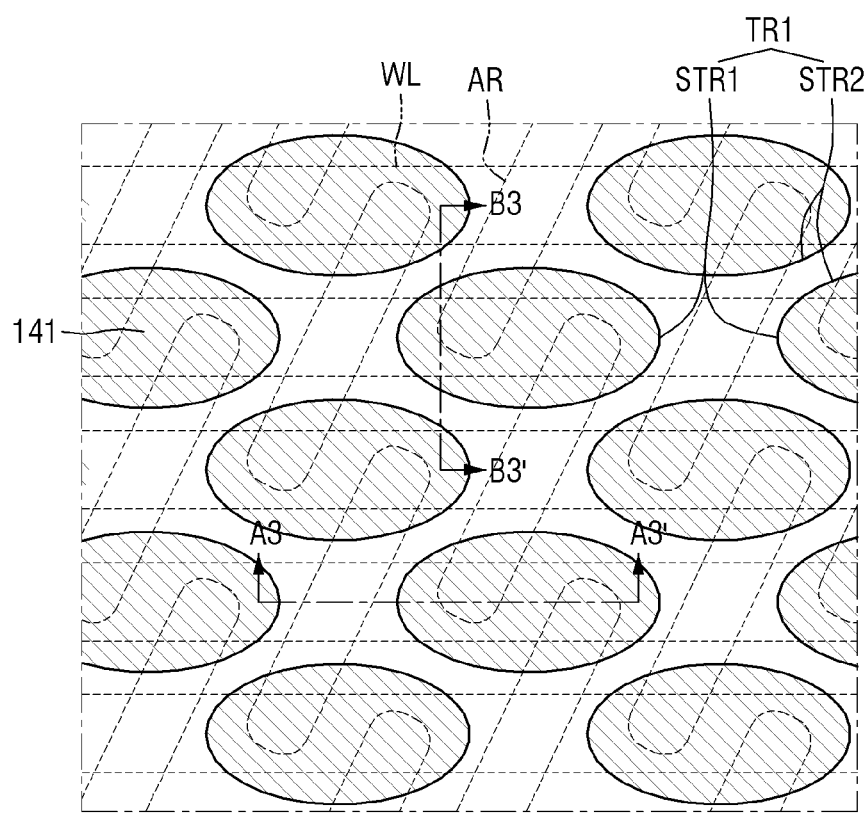
Figure 15:
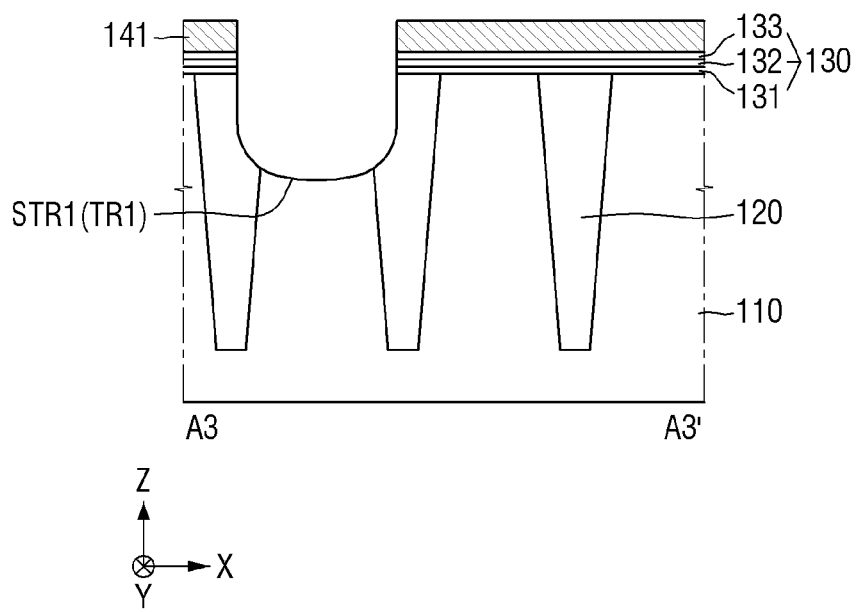
Figure 16:
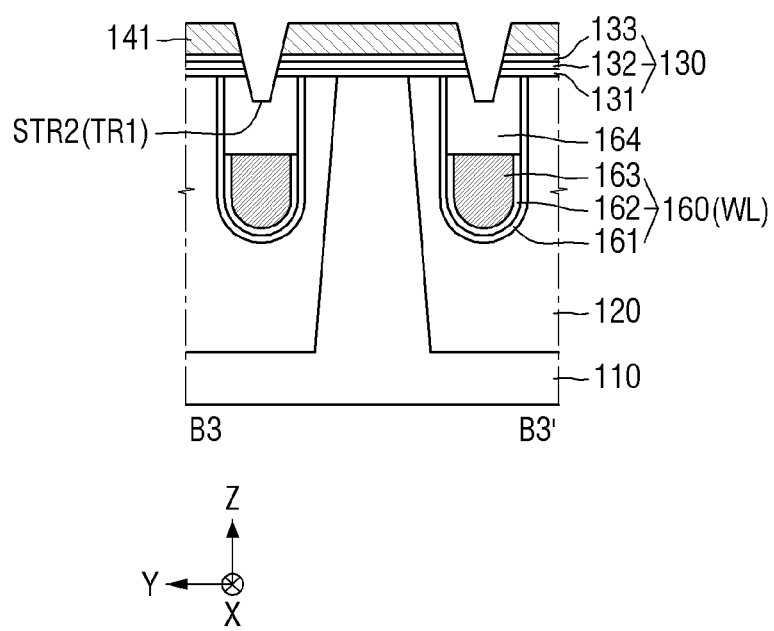

Referring to FIGS. 14 to 16, the first conductive layer 141, the insulating film 130, the substrate 110, the device isolation film 120 and the second capping pattern 164 are formed using the mask film 200 as an etching mask. For reference, FIG. 15 is a cross-sectional view taken along line A3-A3' of FIG. 14, and FIG. 16 is a cross-sectional view taken along line B3-B3' of FIG. 14.

Accordingly, the first trench TR1 may be formed in the substrate 110.

The first trench TR1 may include a first sub-trench STR1 and a second sub-trench STR2.

The first sub-trench STR1 may be formed in the device isolation film 120 adjacent to the central section of an active region AR. Thus, the first sub-trench STR1 may expose the periphery of the central section of the active region AR. The second sub-trench STR2 may be formed in the second capping pattern 164 on the word line 160.

Figure 17:
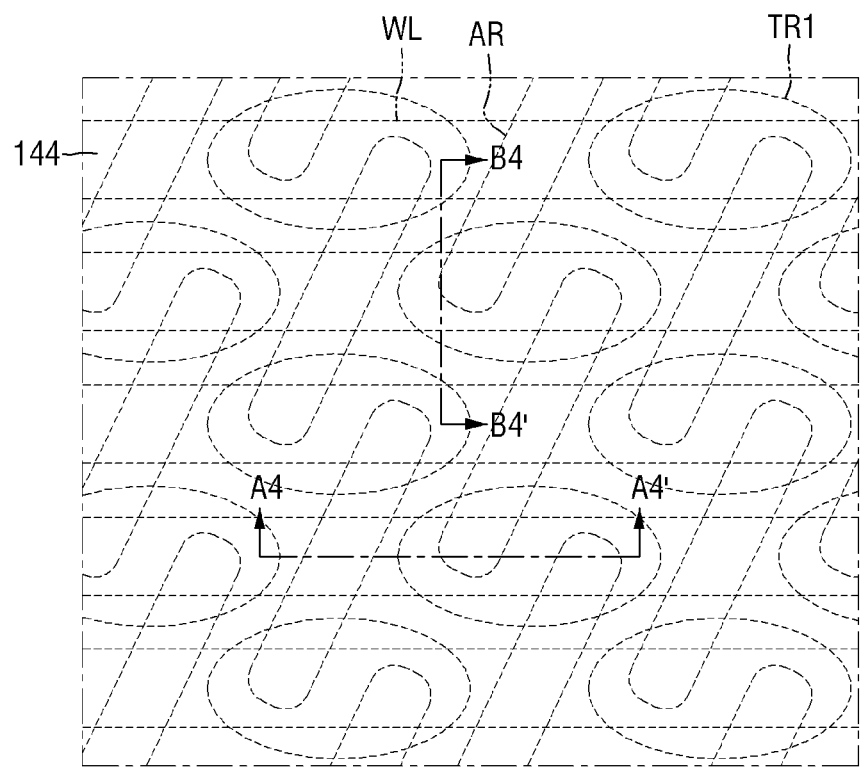
Figure 18:
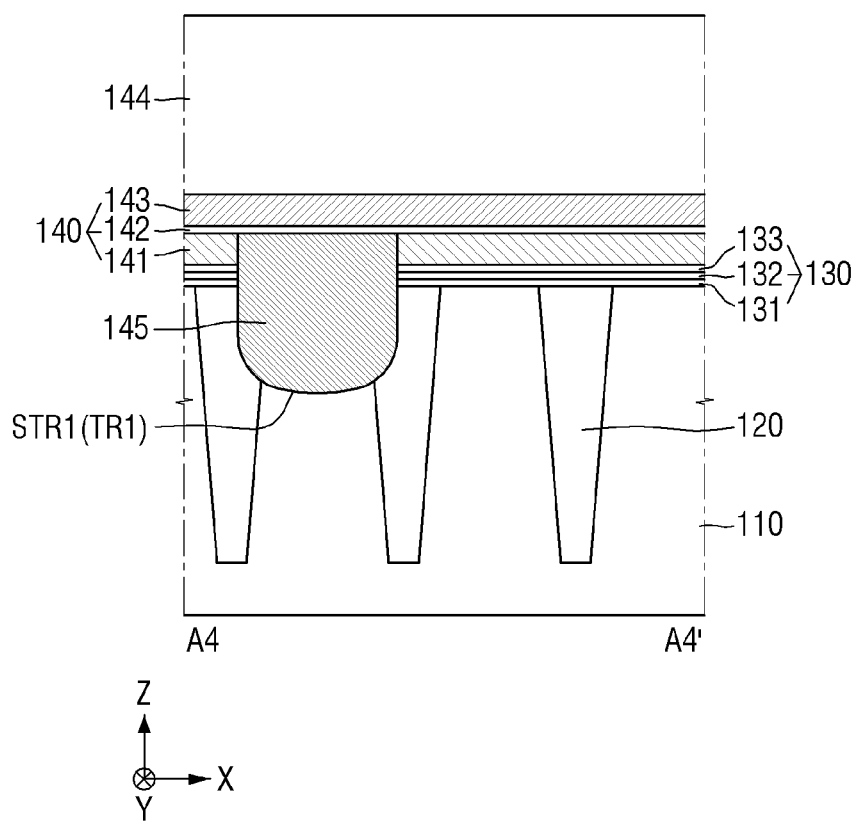
Figure 19:
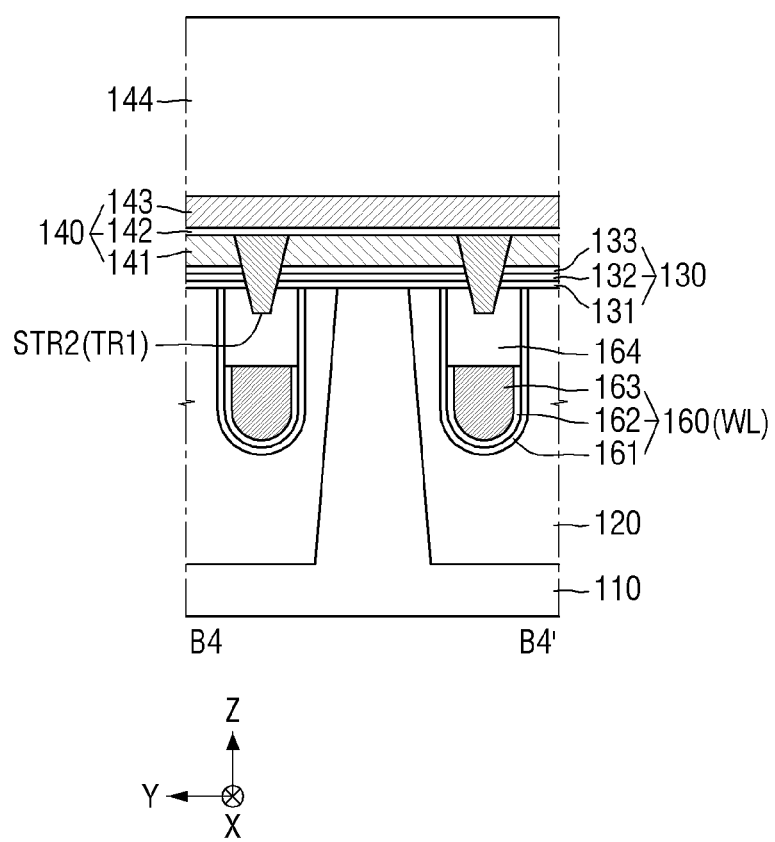

Referring to FIGS. 17 to 19, a sixth conductive layer 145 is formed in the first trench TR1. For reference, FIG. 18 is a cross-sectional view taken along line A4-A4' of FIG. 17, and FIG. 19 is a cross-sectional view taken along line B4-B4' of FIG. 17.

The sixth conductive layer 145 may be formed to fill the first trench TR1. The upper surface of the sixth conductive layer 145 may be formed to be coplanar with the upper surface of the first conductive layer 141.

Then, a second conductive layer 142, a third conductive layer 143 and a first capping pattern 144 are sequentially formed on the first conductive layer 141 and the sixth conductive layer 145.

Figure 20:
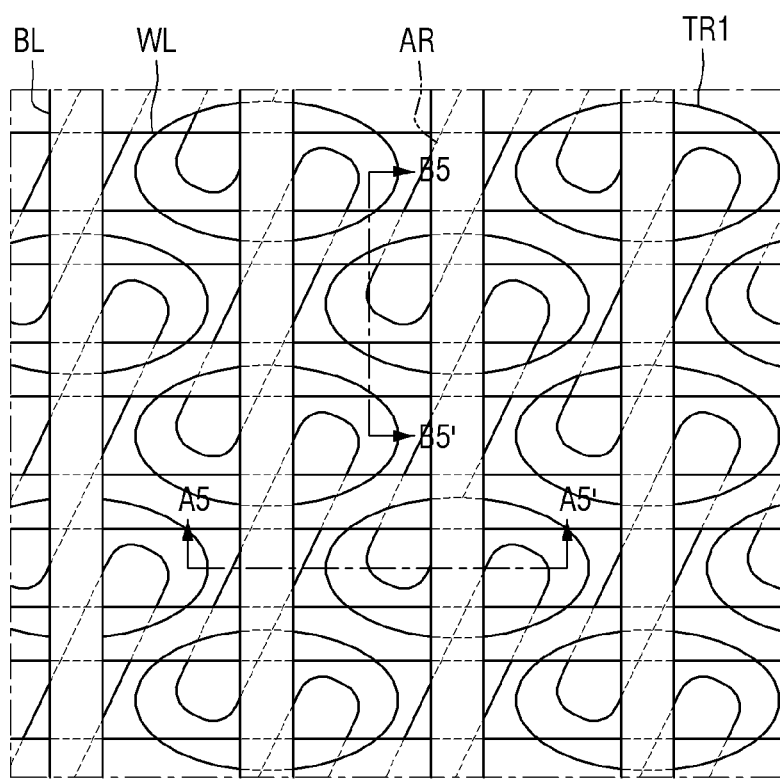
Figure 20:
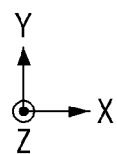
Figure 21:
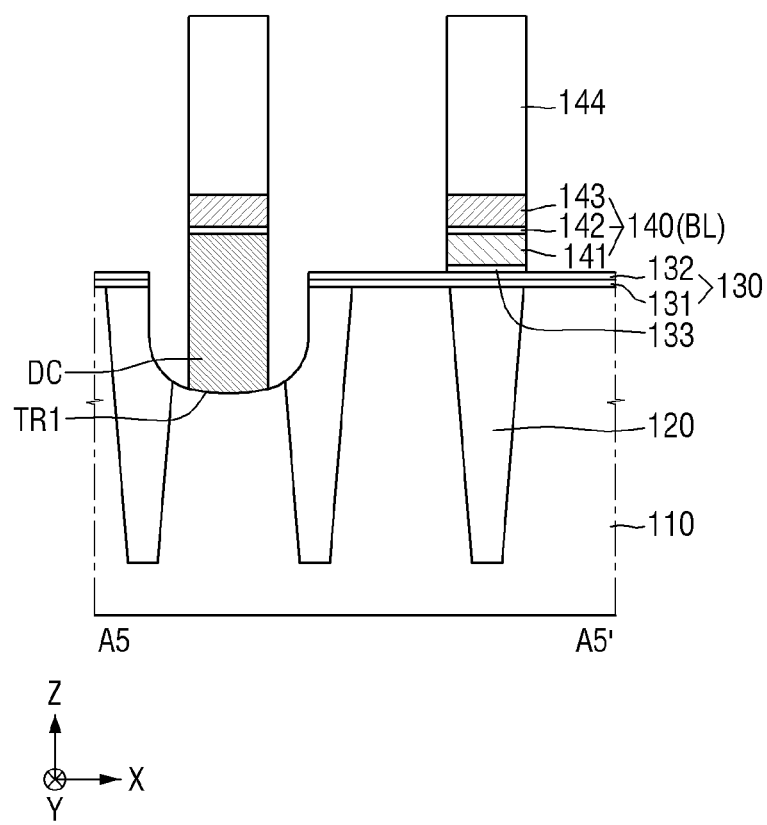
Figure 22:
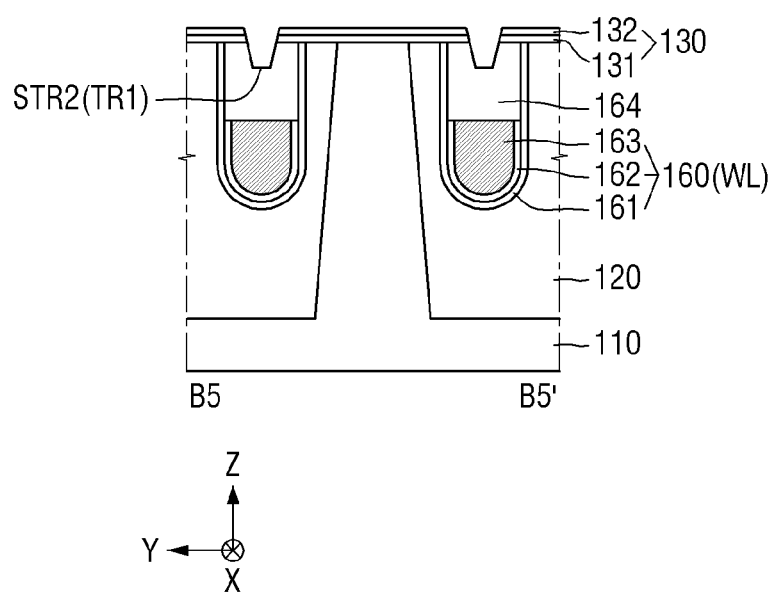

Referring to FIGS. 20 to 22, the first conductive layer 141, the second conductive layer 142, the third conductive layer 143, the first capping pattern 144 and the sixth conductive layer 145 are patterned. For reference, FIG. 21 is a cross-sectional view taken along line A5-A5' of FIG. 20, and FIG. 22 is a cross-sectional view taken along line B5-B5' of FIG. 20.

Accordingly, the bit line 140 may be formed to extend in the second direction Y across the active region AR and the word line 160. At this time, the sixth conductive layer 145 may be patterned to form a direct contact DC. In addition, the width of the bit line 140 may be smaller than the width of the first sub-trench STR1.

In some examples, the third insulating film 133 may also be patterned. The third insulating film 133 may be patterned to have a width equal to the width of the bit line 140.

Figure 23:
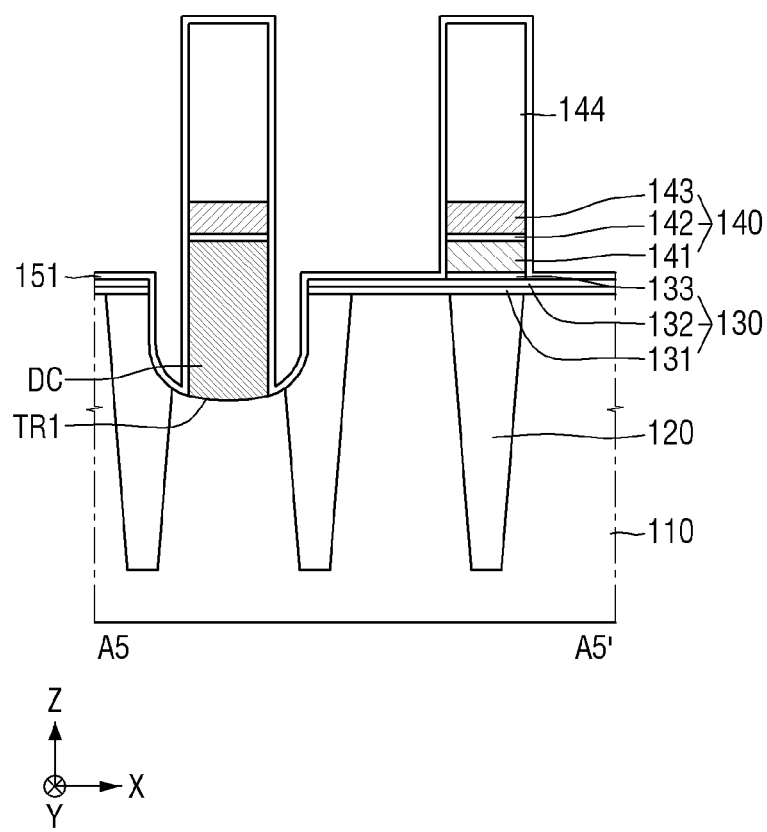
Figure 24:
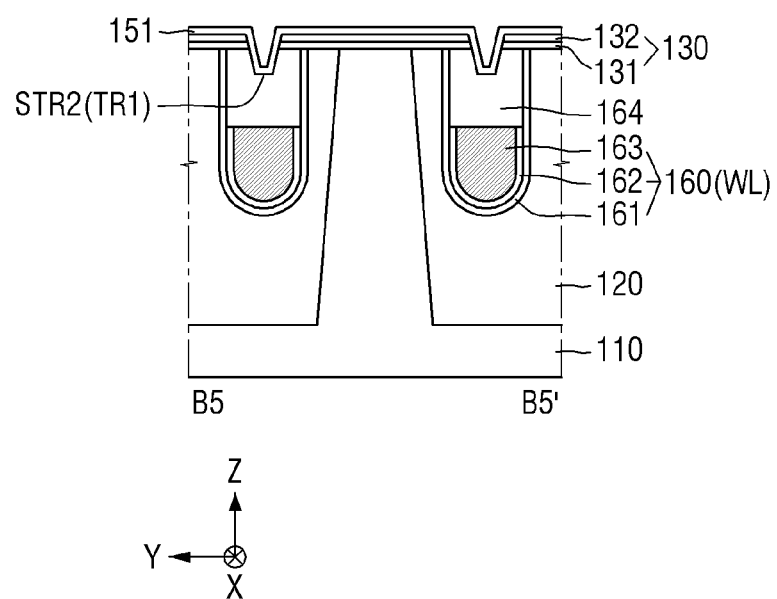

Referring to FIGS. 23 and 24, a first spacer 151 is formed on the resultant structure shown in and described with reference to FIGS. 21 and 22.

The first spacer 151 may be formed to extend along at least a portion of the sidewall of the bit line 140 and the first trench TR1.

The first spacer 151 may include silicon oxide. The first spacer 151 may be formed by atomic layer deposition (ALD), for example.

In some examples, the first spacer 151 may include carbon-doped silicon oxide (SiOC).

Figure 25:
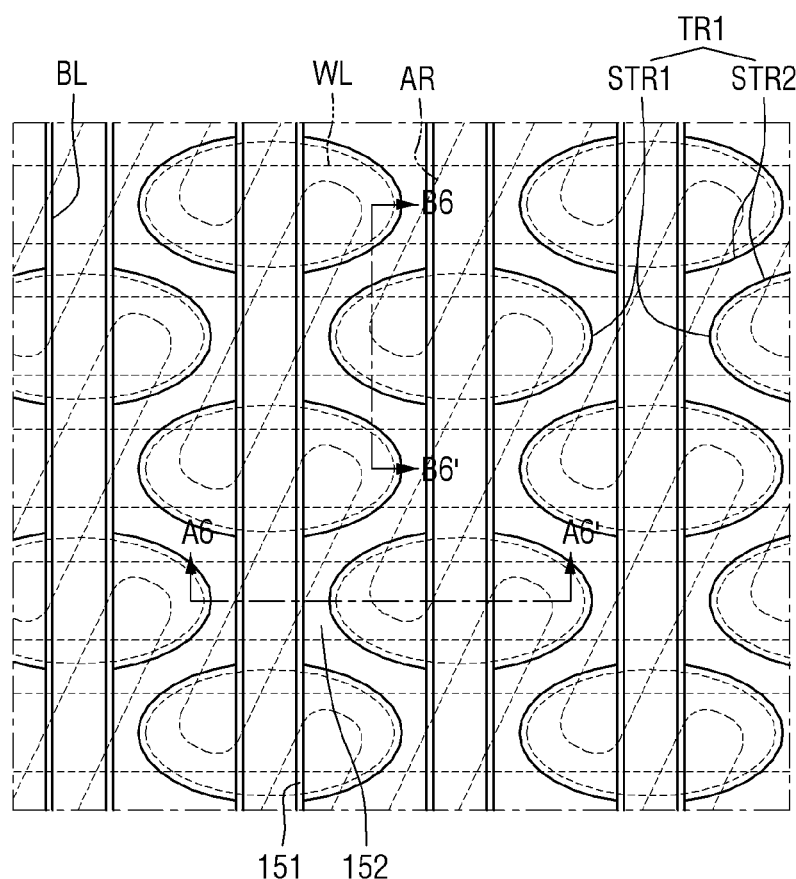
Figure 26:
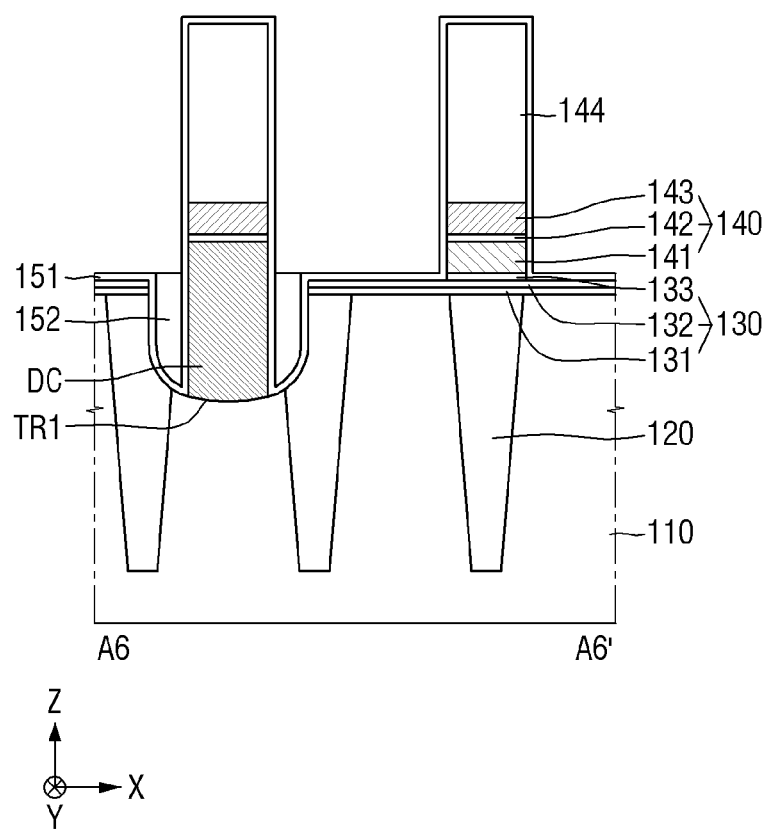
Figure 27:
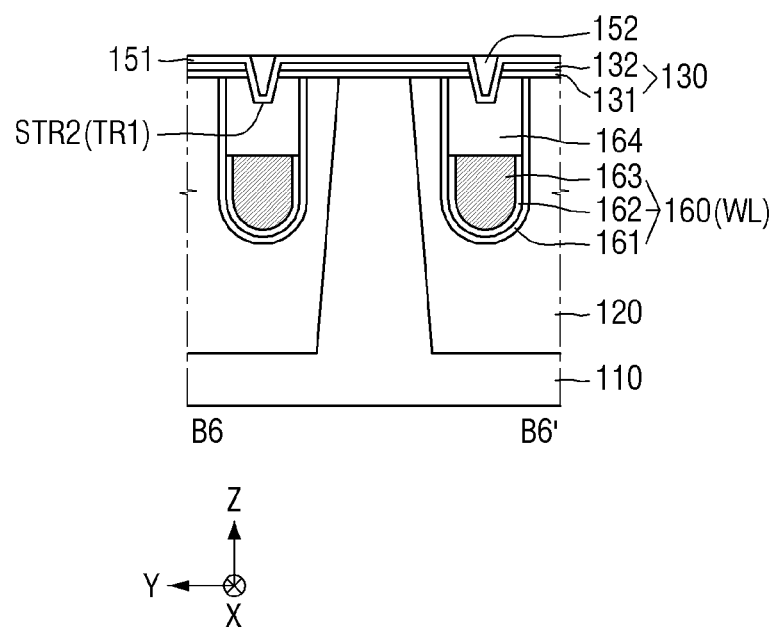

Referring to FIGS. 25 to 27, a second spacer 152 is formed on the first spacer 151 to fill the remainder of the first trench TR1. For reference, FIG. 26 is a cross-sectional view taken along line A6-A6' of FIG. 25, and FIG. 27 is a cross-sectional view taken along line B6-B6' of FIG. 25.

For example, a silicon nitride film may be formed on the resultant structure shown in and described with reference to FIGS. 23 and 24. Then, a portion of the silicon nitride film may be etched by using the first spacer 151 as an etching stopper film. Accordingly, the second spacer 152 may be formed to fill the remainder of the first trench TR1.

Figure 28:
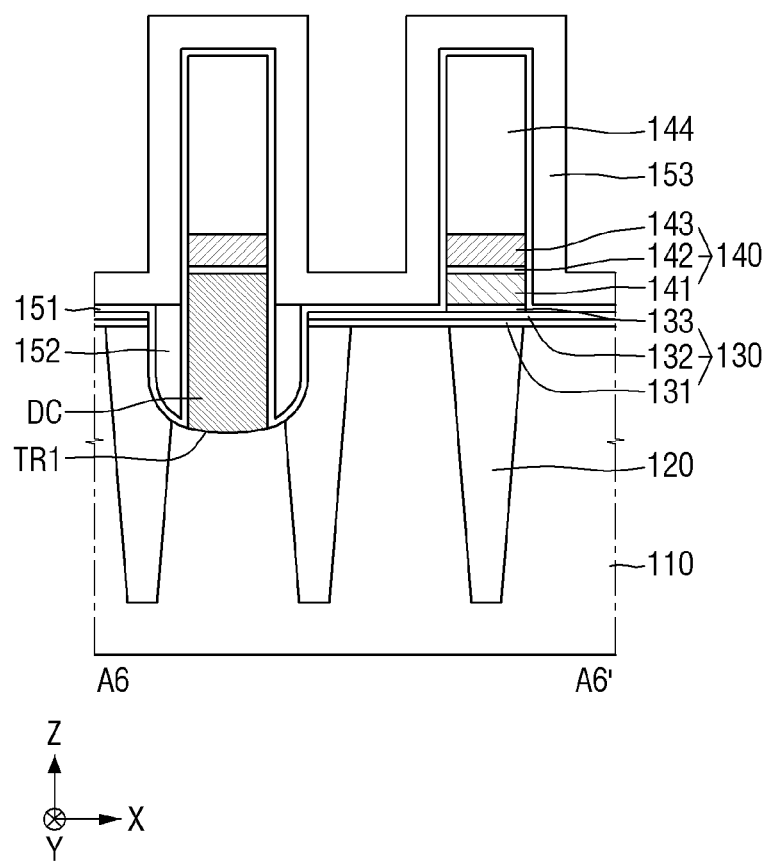
Figure 29:
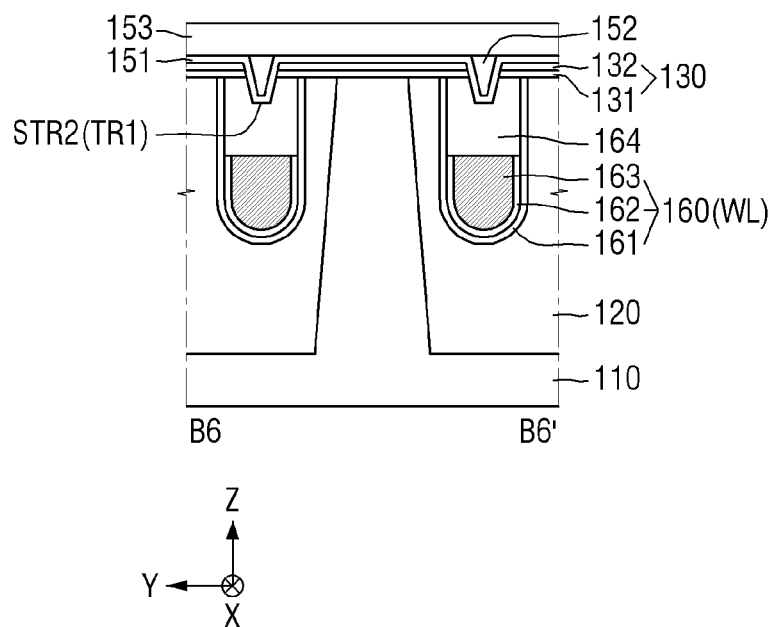

Referring to FIGS. 28 and 29, a third spacer 153 is formed on the first spacer 151 and the second spacer 152.

For example, the third spacer 153 including a silicon oxide film may be formed on the resultant structure shown in and described with reference to FIGS. 26 and 27. The third spacer 153 may be formed to extend along the profile of the first spacer 151 and the second spacer 152, i.e., the third spacer 153 may be formed conformally on the first spacer 151 and the second spacer 152.

Figure 30:
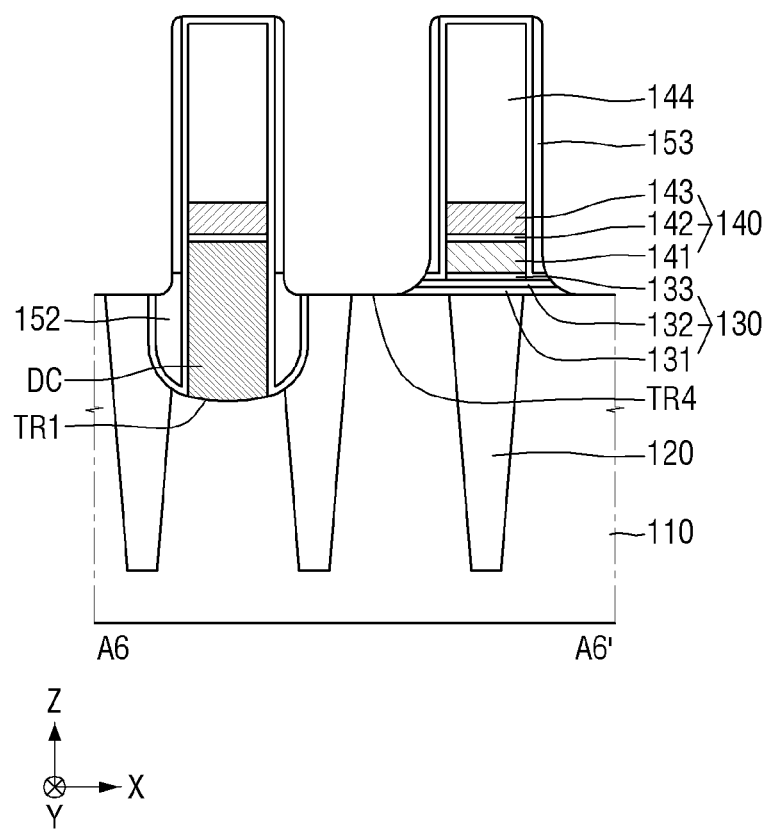
Figure 31:
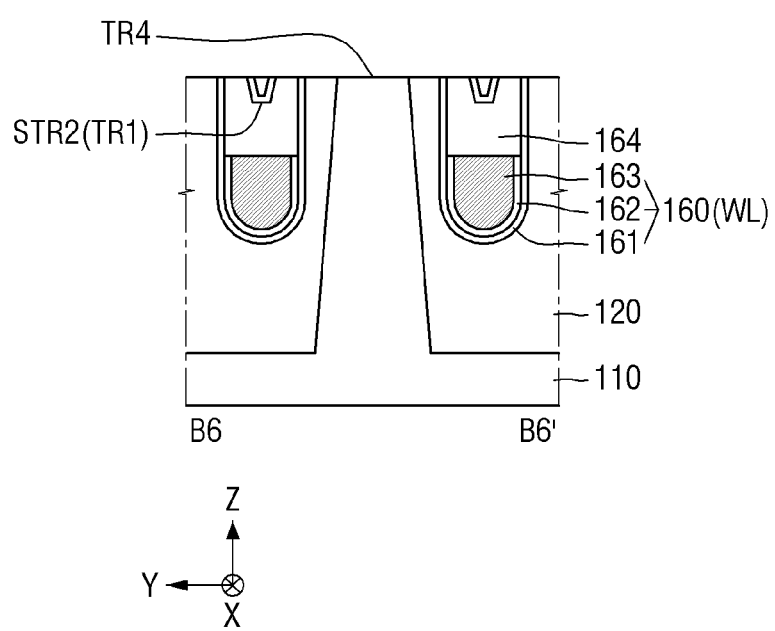

Referring to FIGS. 30 and 31, a fourth trench TR4 is formed between the bit lines 140.

The fourth trench TR4 may be formed to extend along the sidewall of the bit line 140. For example, as shown in FIG. 30, the fourth trench TR4 is formed by etching a portion of the first spacer 151, a portion of the second spacer 152 and a portion of the third spacer 153. Accordingly, the fourth trench TR4 may be elongated in the second direction Y.

Figure 32:
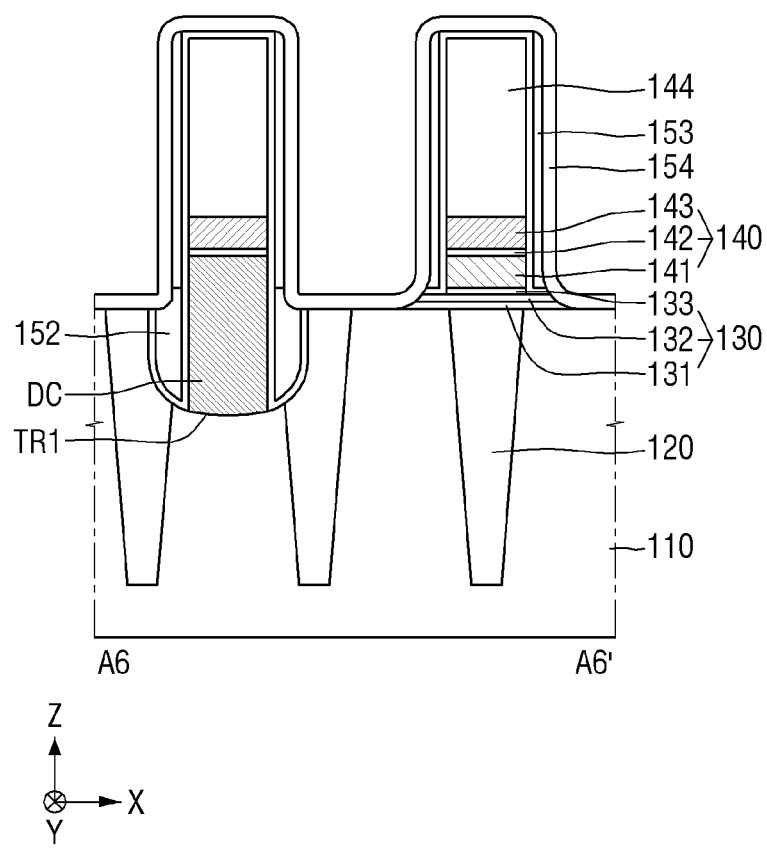
Figure 33:
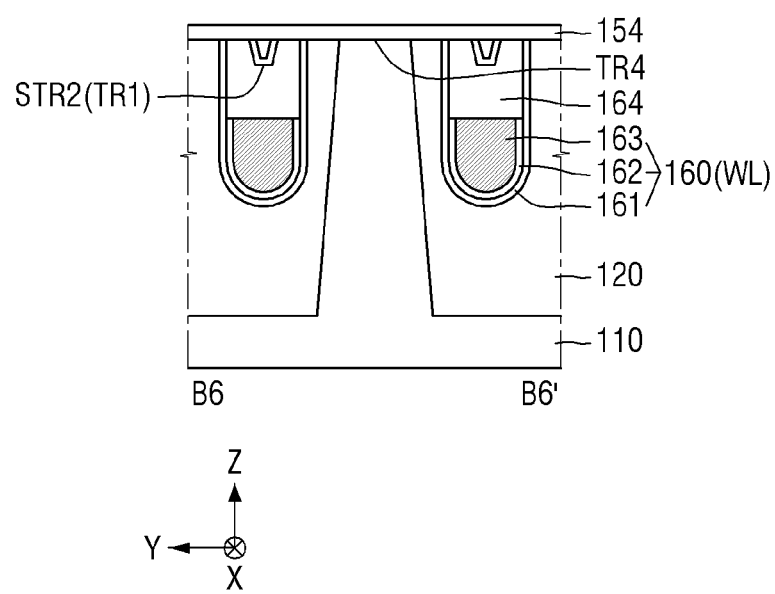

Referring to FIGS. 32 and 33, a fourth spacer 154 is formed in the fourth trench TR4.

The fourth spacer 154 may be formed to extend along the profile of the fourth trench TR4. That is, the fourth spacer 154 may be formed conformally on the second spacer 152 and the third spacer 153.

Figure 34:
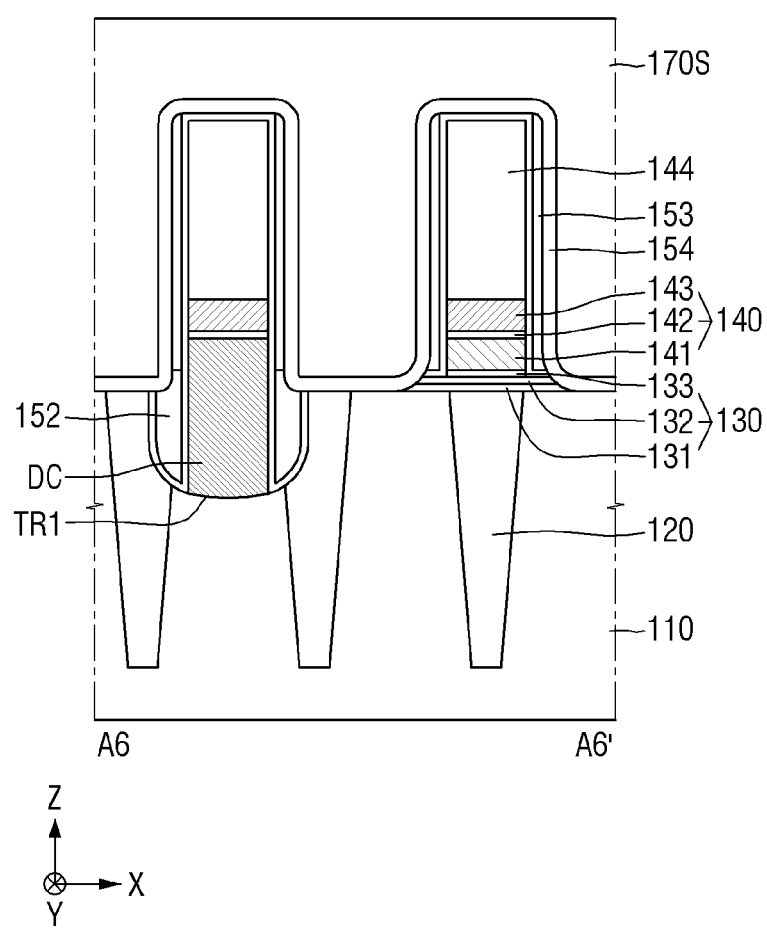
Figure 35:
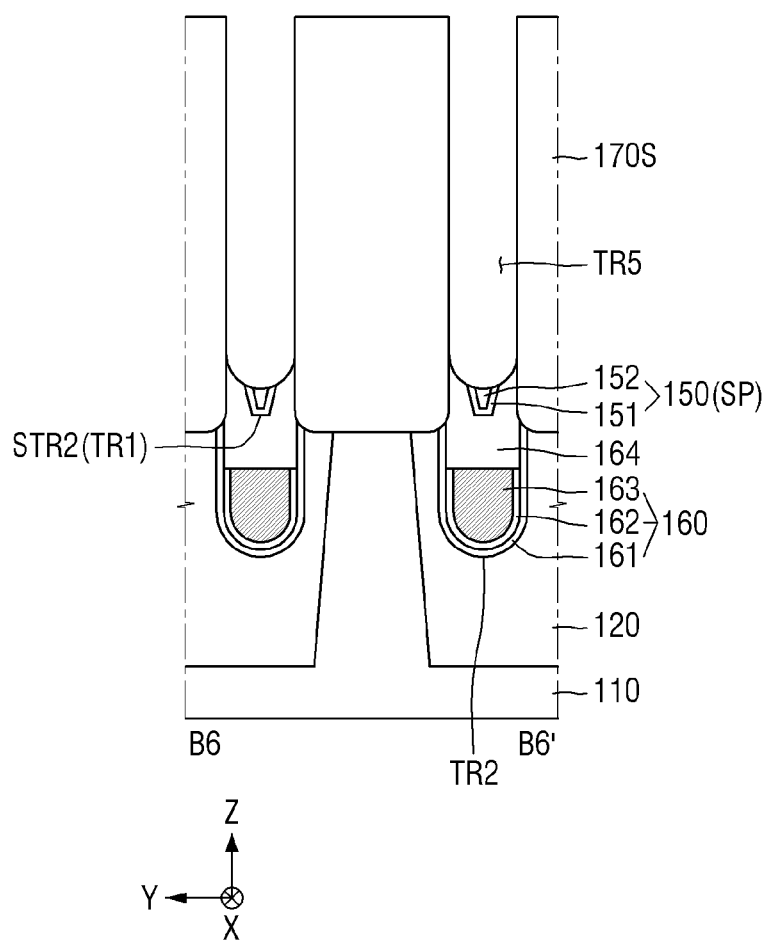

Referring to FIGS. 34 and 35, a sacrificial film 170S may be formed on the fourth spacer 154.

The sacrificial film 170S may be formed to cover the resultant structure shown in and described with reference to FIGS. 32 and 33.

Then, a fifth trench TR5 may be formed in the sacrificial film 170S. As shown in FIG. 35, the fifth trench TR5 may be formed on the word line 160. Also, the fifth trench TR5 may be elongated in the direction in which the word line 160 extends. That is, the fifth trench TR5 may be elongated in the first direction X.

In some examples, the fifth trench TR5 may be formed in a portion of the first spacer 151 on the word line 160 and a portion of the second spacer 152 on the word line 160.

Figure 36:
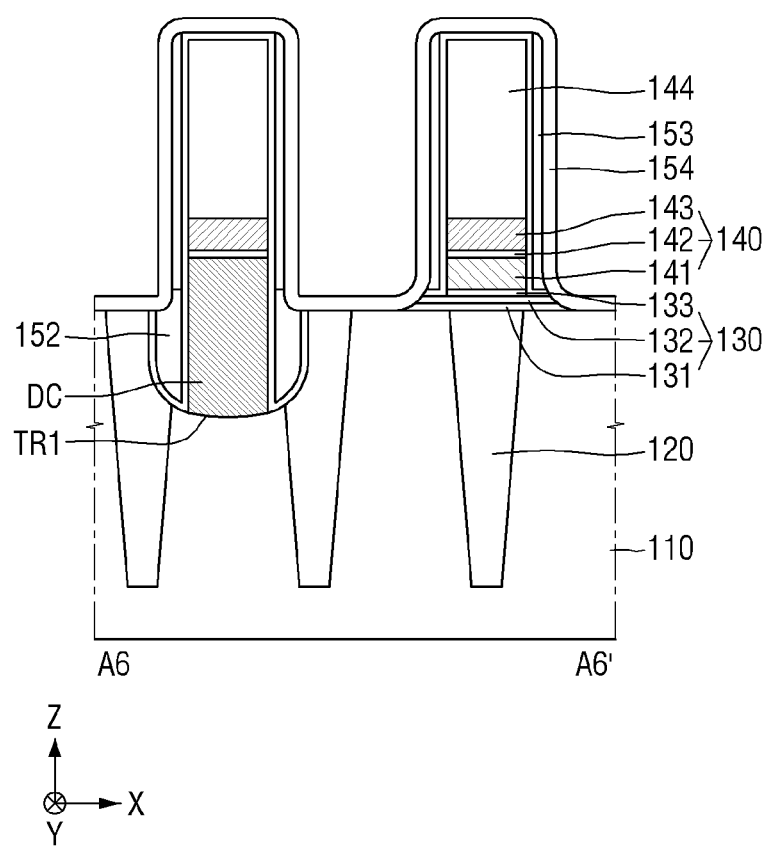
Figure 37:
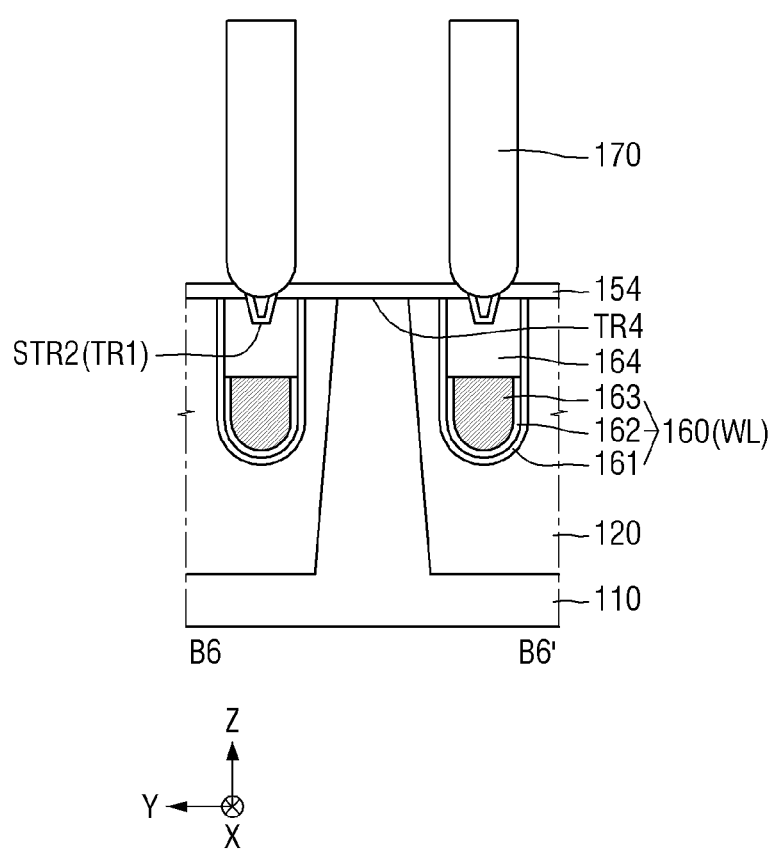

Referring to FIGS. 36 and 37, a fence 170 is formed on the word line 160.

For example, the fifth trench TR5 may be filled with an insulating material containing silicon nitride. Then, the sacrificial film 170S may be removed. Thus, on the word line 160, the fence 170 may be formed to extend in the direction in which the word line 160 extends.

Figure 38:
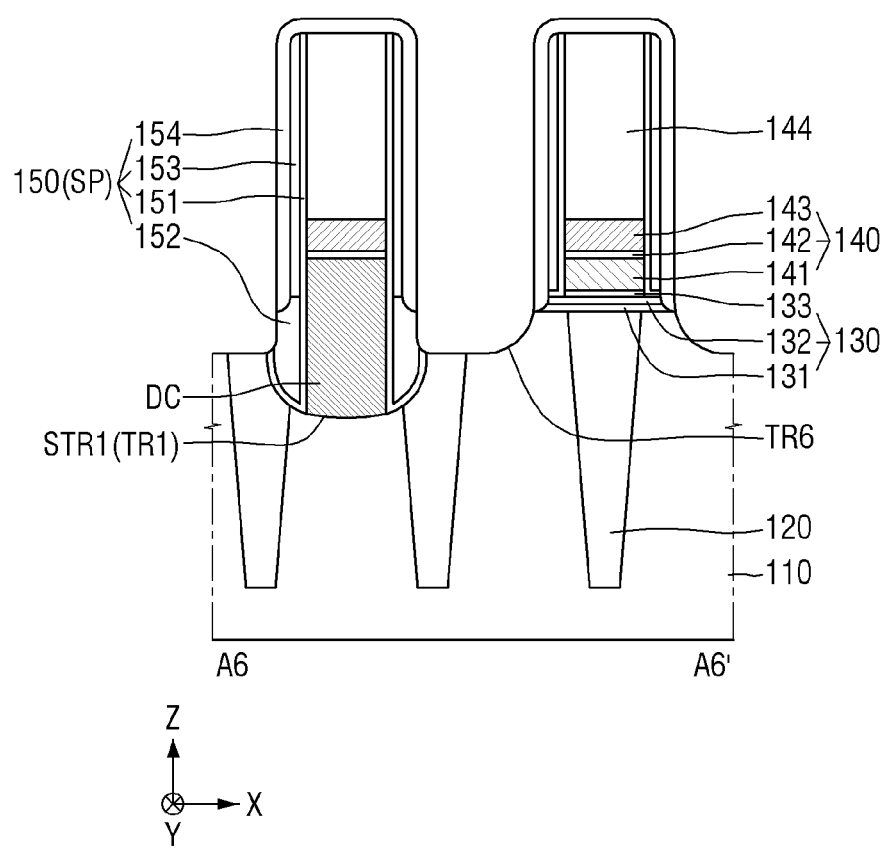
Figure 39:
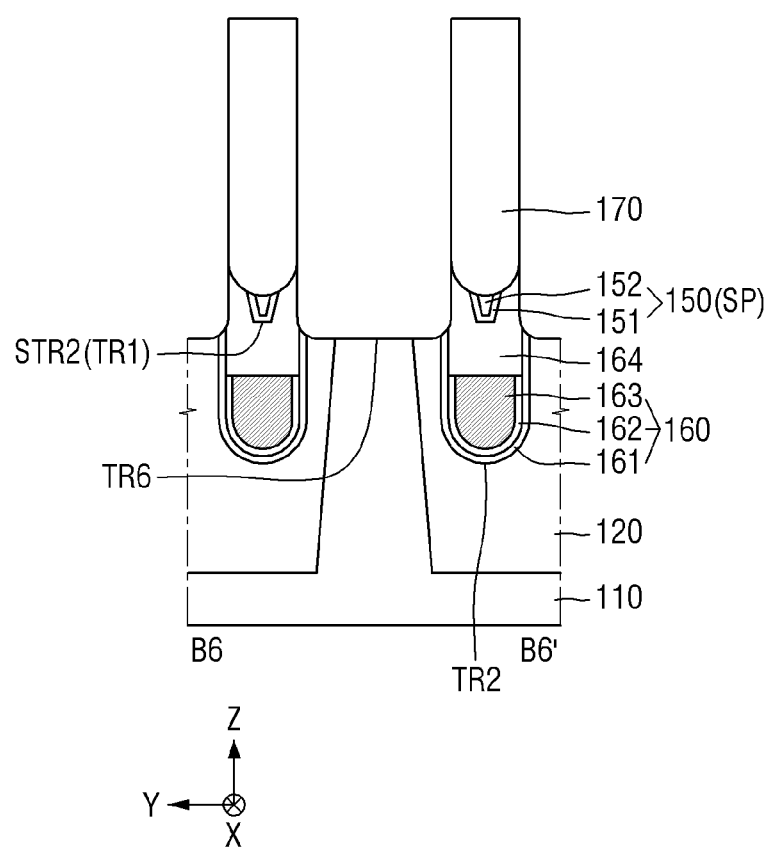

Referring to FIGS. 38 and 39, a sixth trench TR6 is formed between the bit line 140 and the word line 160.

The sixth trench TR6 may be formed to expose a portion of the substrate 110.

As shown in FIG. 38, the sixth trench TR6 may expose the substrate 110 by etching the structure between the bit lines 140. For example, a portion of the fourth spacer 154, a portion of the substrate 110, and a portion of the device isolation film 120 may be etched to expose the substrate 110 between the bit lines 140.

By forming the sixth trench TR6, a spacer structure 150 including the first spacer 151, the second spacer 152, the third spacer 153 and the fourth spacer 154 may be formed.

In addition, as shown in FIG. 39, the sixth trench TR6 may expose the substrate 110 between the word lines 160. For example, a portion of the substrate 110 between the fences 170 and a portion of the device isolation film 120 may be etched to expose the portion of the substrate 110 interposed between the word lines 160.

Figure 40:
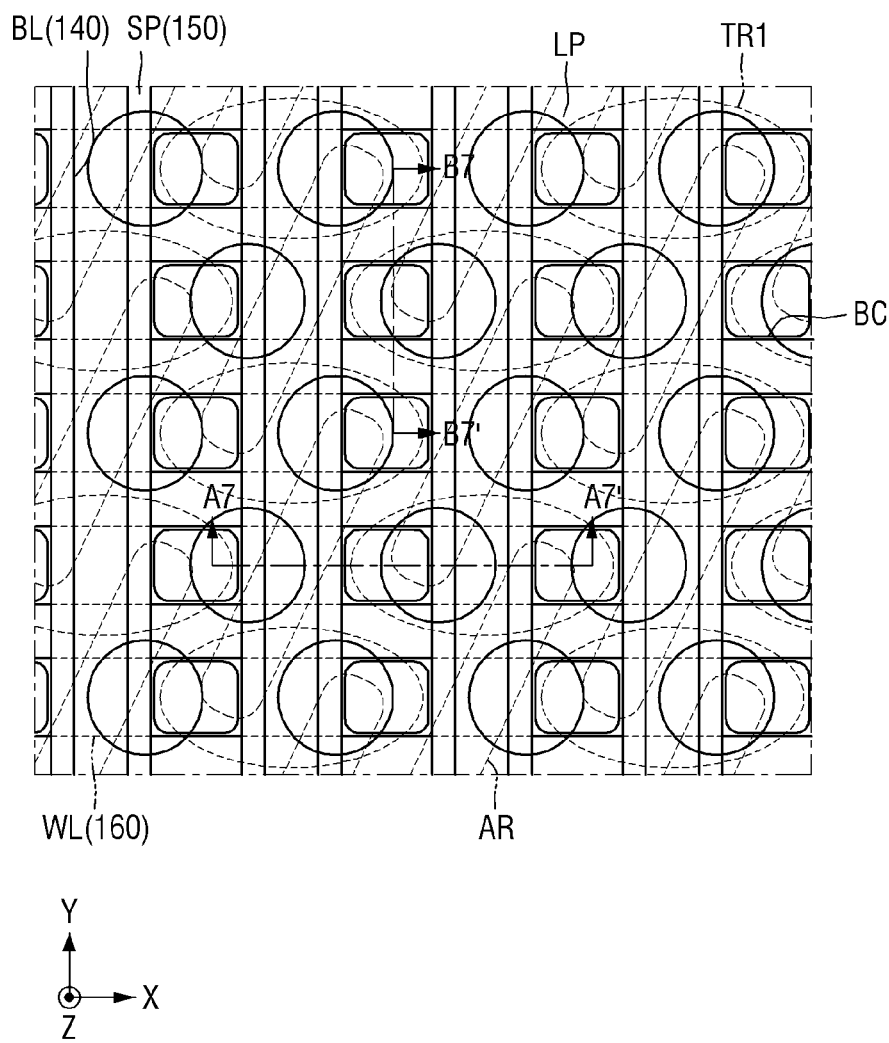
Figure 41:
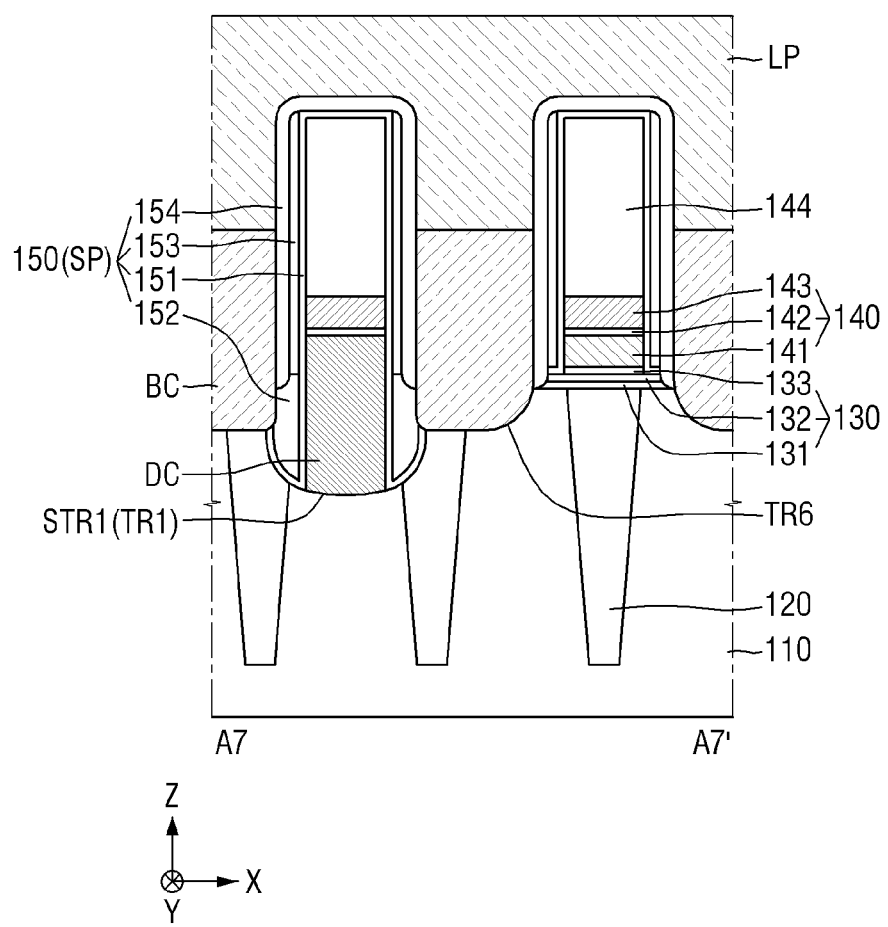
Figure 42:
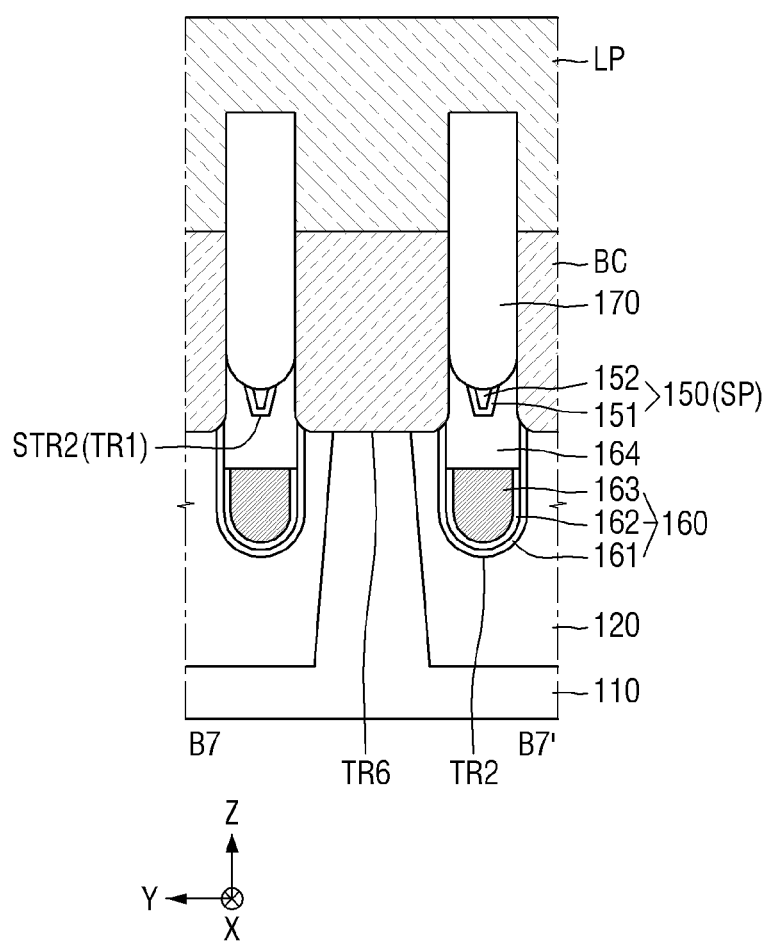

Referring to FIGS. 40 to 42, a buried contact BC is formed in the sixth trench TR6. For reference, FIG. 41 is a cross-sectional view taken along line A7-A7' of FIG. 40, and FIG. 42 is a cross-sectional view taken along line B7-B7' of FIG. 40.

The upper surface of the buried contact BC may be formed at a level lower than the upper surface of the spacer structure 150 and the fence 170. For example, a polysilicon film may be formed on the resultant structure shown in and described with reference to FIGS. 38 and 39. Then, an etchback process may be performed so that the upper surface of the polysilicon film becomes situated at a level lower than that of the upper surface of the spacer structure 150 and the fence 170. Accordingly, the buried contact BC may form a plurality of isolated regions which are spaced apart from each other by the spacer structure 150 and the fence 170.

Then, a landing pad LP may be formed on the buried contact BC. The upper surface of the landing pad LP may be formed at a level higher than that of the upper surface of the spacer structure 150.

Figure 43A:
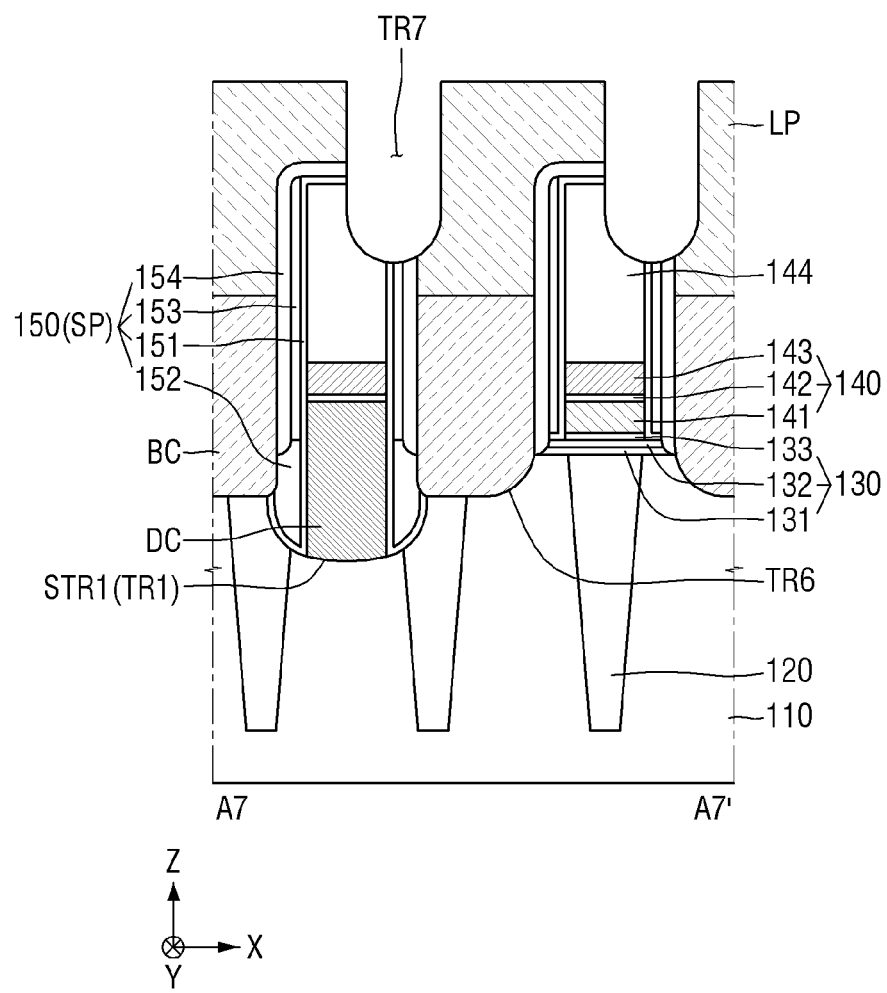
Figure 44:
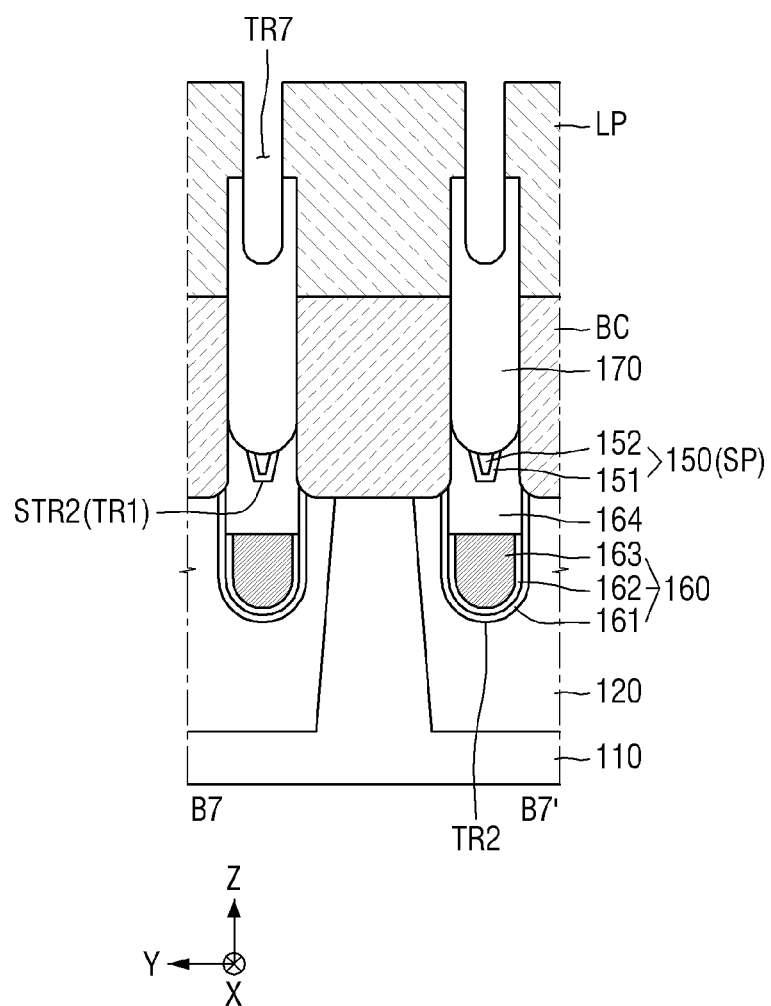

Referring to FIGS. 43a and 44, a seventh trench TR7 is formed in the landing pad LP.

That is, the landing pad LP may be patterned by the seventh trench TR7. Thus, the landing pad LP may form a plurality of isolated regions which are spaced apart from each other by the seventh trench TR7.

In some examples, the seventh trench TR7 may be formed to overlap a portion of the bit line 140 and the spacer structure 150. Accordingly, a portion of the first capping pattern 144, the first spacer 151, the third spacer 153 and the fourth spacer 154 may be exposed.

Figure 43B:
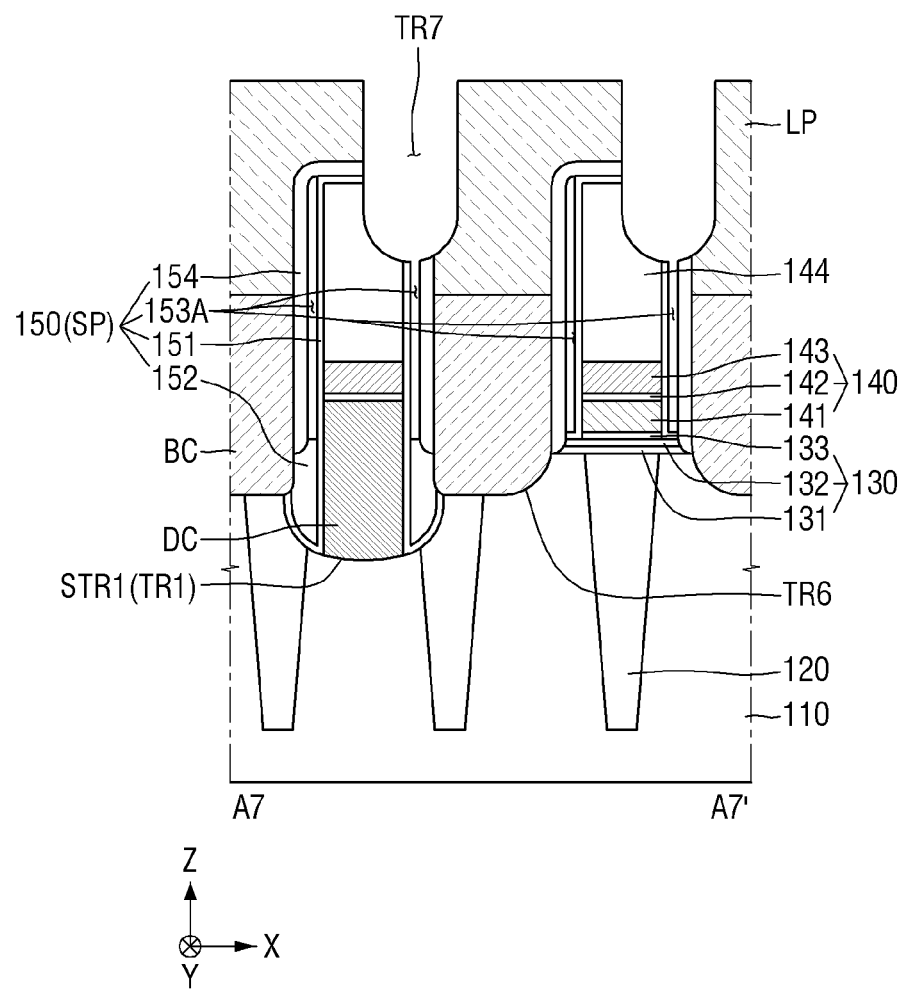

Referring to FIG. 43b, a method for fabricating a semiconductor device according to the inventive concept may further include removing the third spacer 153 to form an air spacer 153A.

For example, after the seventh trench TR7 is formed, a wet etching process can be performed to form the air spacer 153A. For example, the third spacer 153 exposed by the seventh trench TR7 may be removed by using a wet etching process using hydrogen fluoride (HF) or phosphoric acid ($H_3PO_4$).

Because the third spacer 153 includes a silicon oxide film, the third spacer 153 can be easily removed by a wet etching process. However, in a case in which the first spacer 151 includes SiOC, a wet etching process is not carried out to remove the first spacer 151.

In some examples, forming the seventh trench TR7 and forming the air spacer 153A may be performed simultaneously.

Figure 43C:
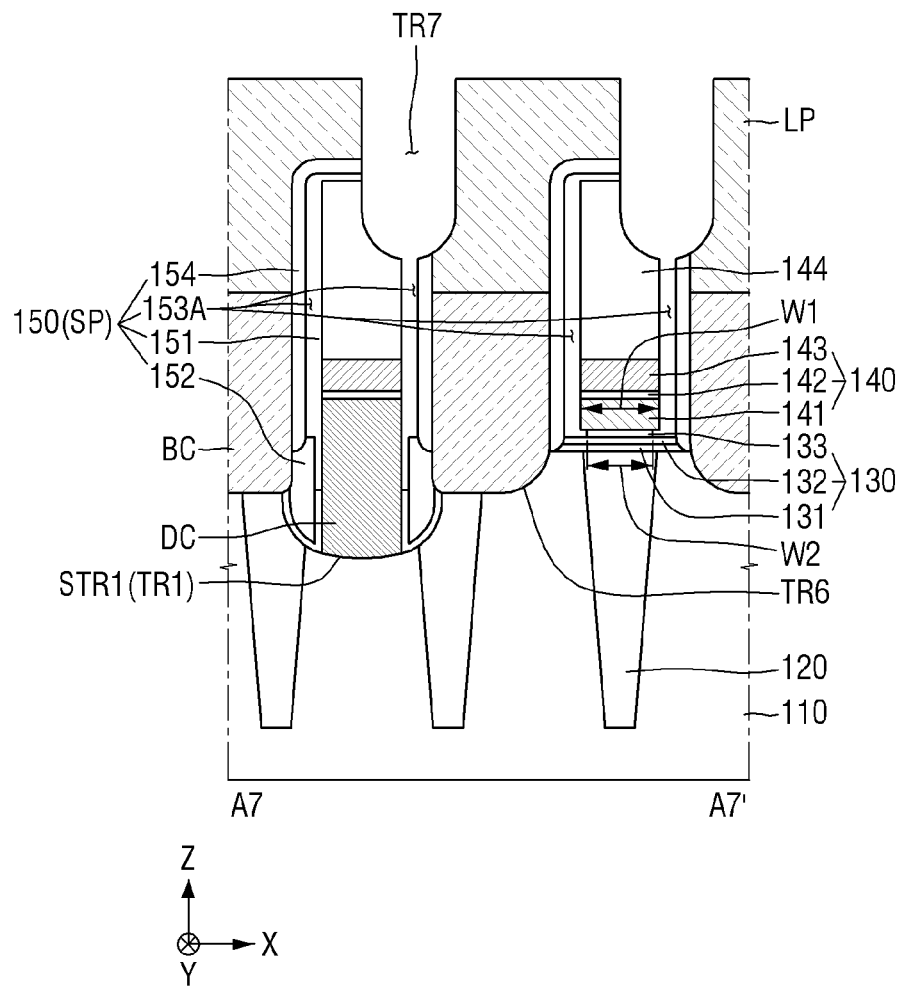

Referring to FIG. 43c, a method for fabricating a semiconductor device according to the inventive concept may further include forming an air spacer 153A by removing a portion of the first spacer 151 and the third spacer 153.

For example, after the seventh trench TR7 is formed, a wet etching process may be performed to form the air spacer 153A. A portion of the first spacer 151 and the third spacer 153 exposed by the seventh trench TR7 are removed by a wet etching process using, for example, hydrogen fluoride (HF) or phosphoric acid ($H_3PO_4$).

In a case in which the first spacer 151 includes SiOC, the resistance to the wet etching process of the first spacer 151 may be lowered during the manufacturing process. For example, in a case in which an annealing process or an ashing process is performed in the manufacturing process of a semiconductor device, the resistance of SiOC to being etched by the wet etching process may be lowered. Accordingly, a portion of the first spacer 151 including SiOC can be removed by a wet etching process. Because the third spacer 153 may include a silicon oxide film, the third spacer 153 can be easily removed by a wet etching process.

In some examples, forming the seventh trench TR7 and forming the air spacer 153A may be performed simultaneously.

Figure 45:
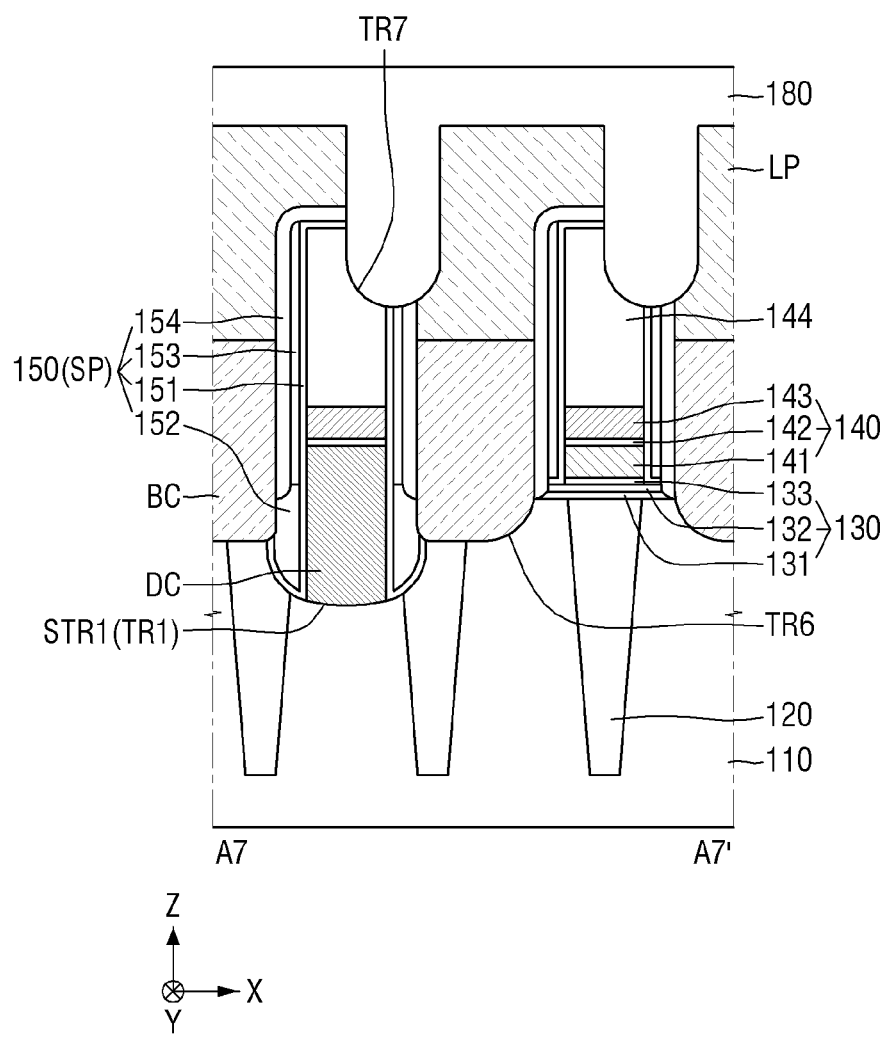
Figure 46:
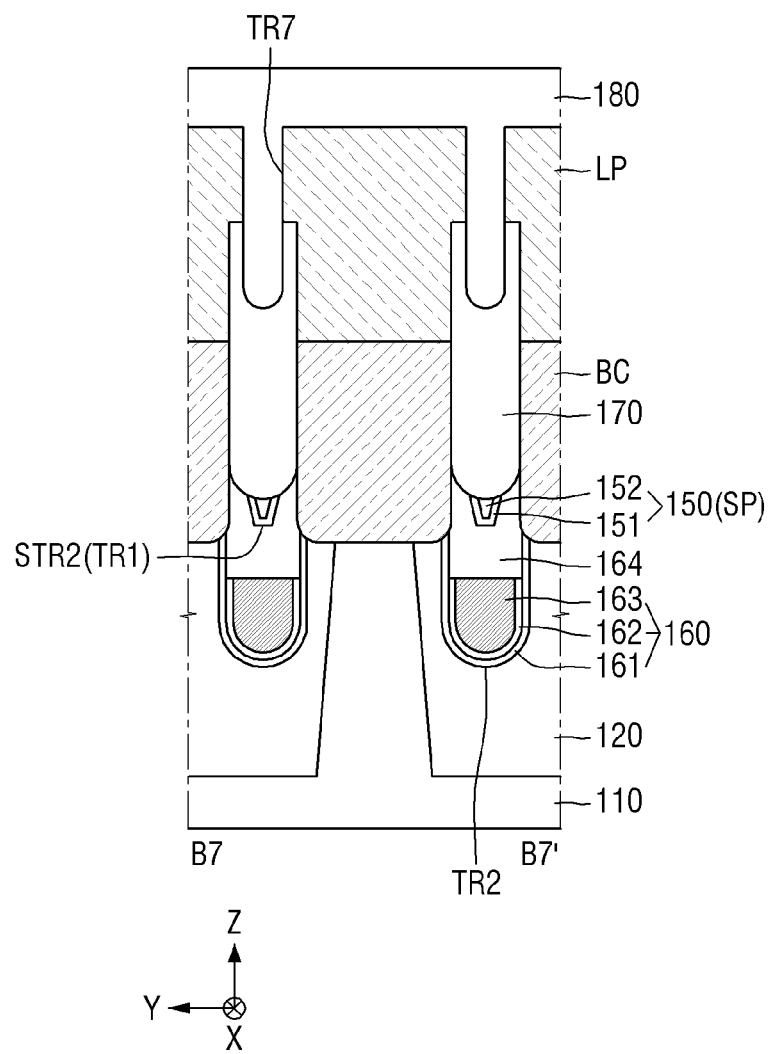

Referring to FIGS. 45 and 46, an interlayer insulating film 180 is formed on a landing pad LP.

The interlayer insulating film 180 may be formed to fill the seventh trench TR7. Thus, the landing pad LP may form a plurality of isolated regions which are spaced apart from each other by the interlayer insulating film 180.

Next, referring to FIGS. 1 to 4, a capacitor 190 is formed on the resultant structure shown in and described with reference to FIGS. 45 and 46. Thus, a semiconductor device according to the inventive concept can be manufactured.

Figure 3D:
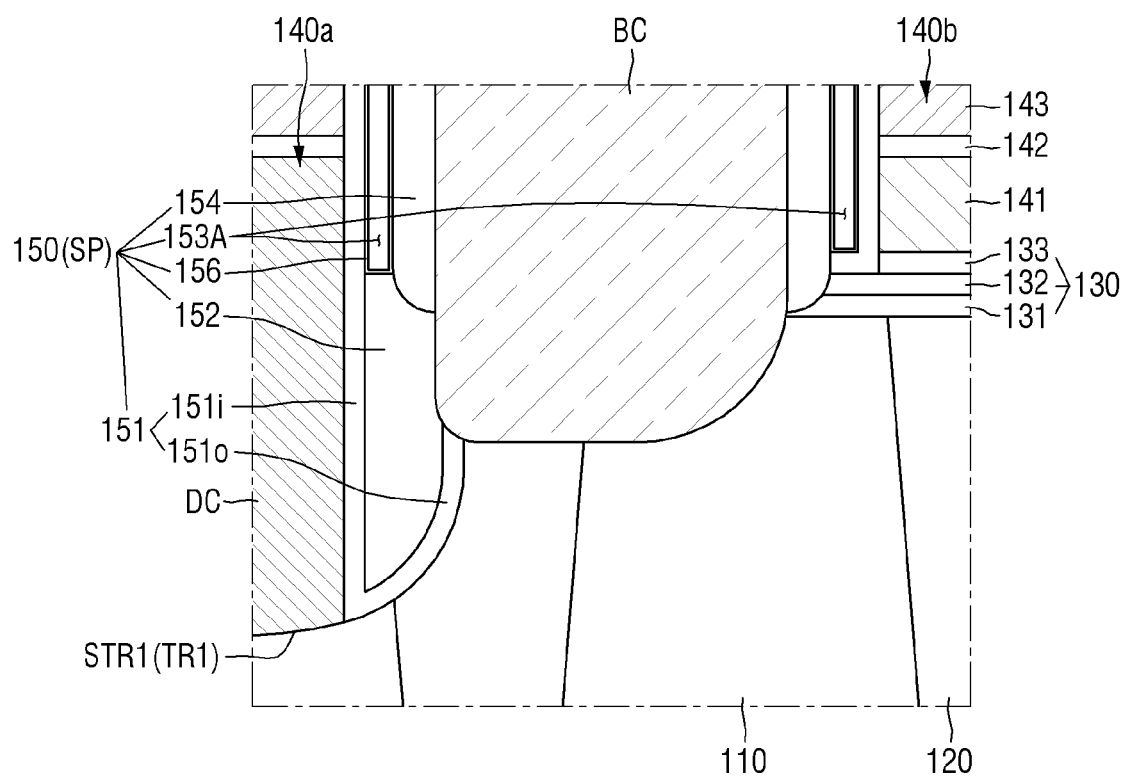
Figure 3E:
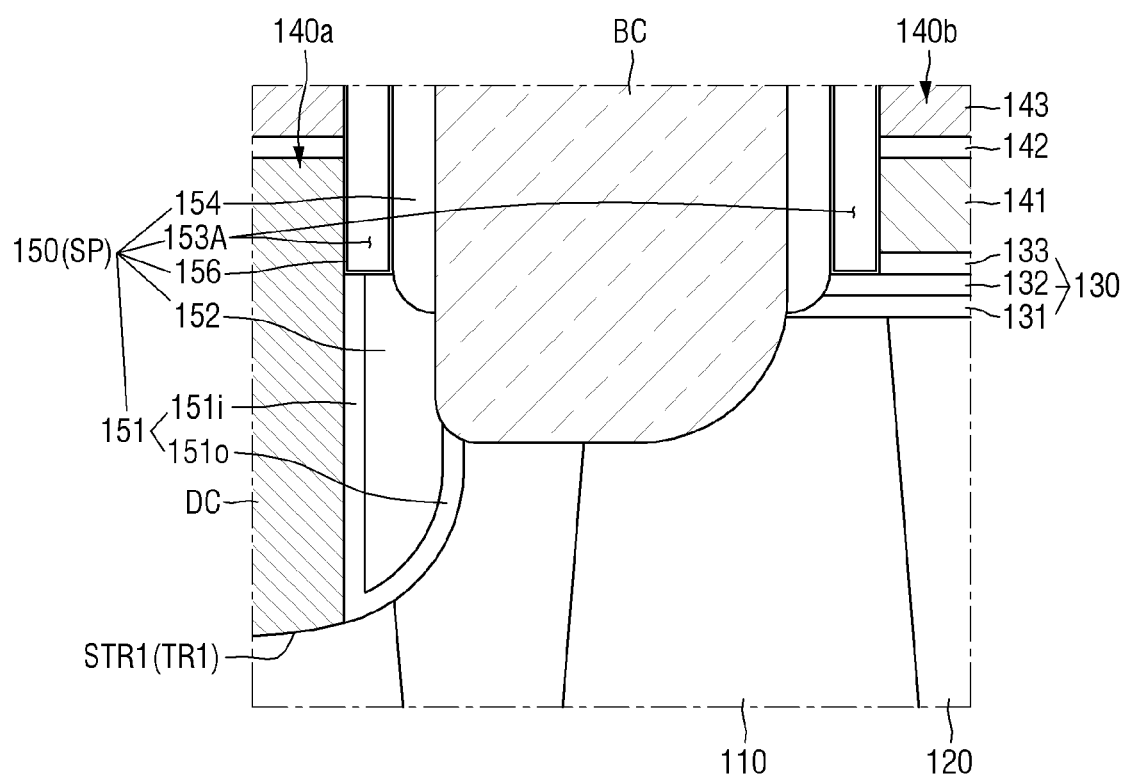
Figure 3F:
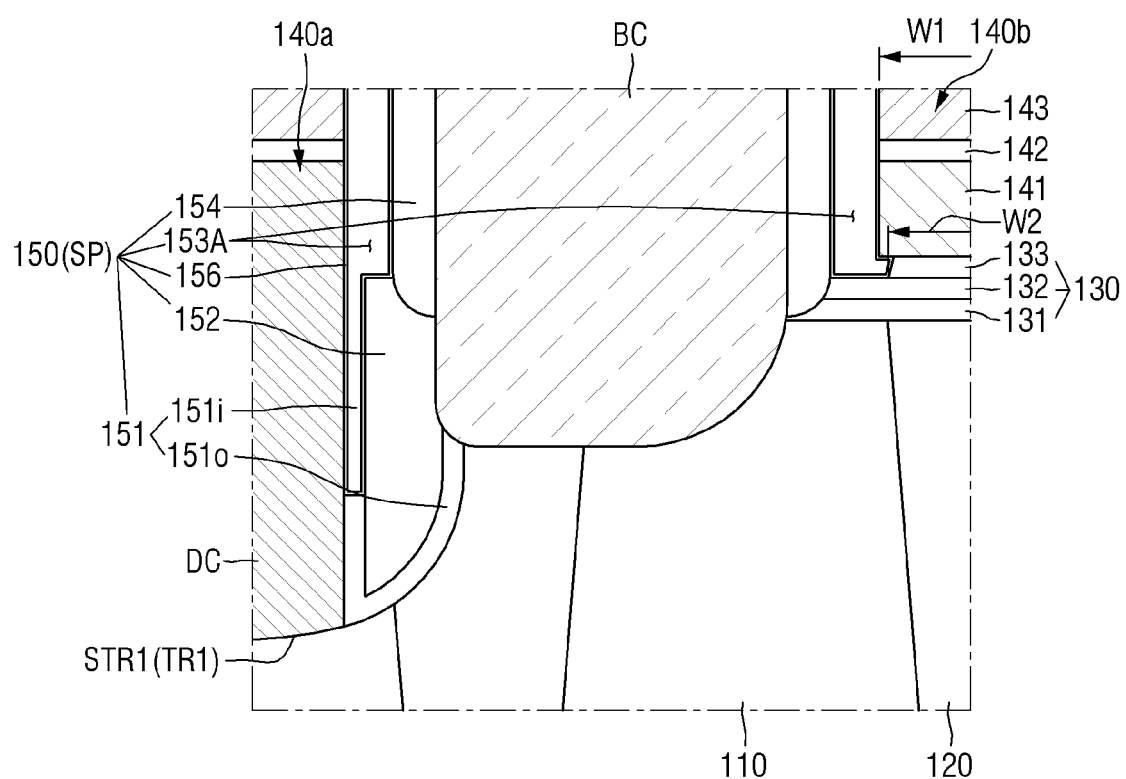

In the process of forming the interlayer insulating film 180, the sixth spacer 156 shown in and described with reference to FIGS. 3e to 3f may be formed. For example, the interlayer insulating film 180 may not fill the air spacer 153A while filling the seventh trench TR7. This may be attributed to the thinness of the air spacer 153A.

However, in the process of forming the interlayer insulating film 180, a material constituting the interlayer insulating film 180 may be thinly coated along the surfaces delimiting the air spacer 153A. Thus, as shown in FIGS. 3d, 3e and 3f, the sixth spacer 156 may be formed along the outer periphery of the air spacer 153A. However, in some examples, the sixth spacer 156 may not be formed.

Although the present inventive concept has been particularly shown and described with reference to examples thereof, it will be understood by those of ordinary skill in the art that various changes in form and details may be made thereto without departing from the spirit and scope of the present inventive concept as defined by the following claims. It is therefore desired that the present examples be considered in all respects as illustrative and not restrictive, reference being made to the appended claims rather than the foregoing description to indicate the scope of the inventive concept.

What is claimed is:

1. A semiconductor device comprising:
   a substrate including a first active region;
   a first bit line on the first active region;
   a first spacer extending along at least a portion of a side surface of the first bit line, the first spacer including SiOC in contact with said at least a portion of the side surface of the first bit line;
   a second spacer on the first spacer, the second spacer including silicon nitride;
   a device isolation film defining the first active region;
   a second bit line spaced apart from the first bit line on the device isolation film; and
   an insulating film including silicon oxide between the device isolation film and the second bit line,
   wherein a width of the insulating film is less than a width of the second bit line both taken in a first direction in a horizontal plane.

2. The semiconductor device of claim 1, wherein the substrate has a first trench therein,
   at least a portion of the first trench extends in the first active region, and the first spacer is constituted by an outer portion of SiOC that lines part of the first trench and an inner portion of SiOC that extends along at least a portion of a side surface of the first bit line, and
   the second spacer is interposed in a region of the first trench between the inner portion of SiOC and the outer portion of SiOC constituting the first spacer.

3. The semiconductor device of claim 2, wherein the device isolation film defines a second active region spaced apart from the first active region, a second trench extending in the second active region and the device isolation film; and
   a buried contact spaced apart from the first bit line and filling the second trench.

4. The semiconductor device of claim 3, wherein the outer portion of SiOC is contiguous with the inner portion of SiOC.

5. The semiconductor device of claim 4, wherein the outer portion of SiOC constituting the first spacer is in contact with the buried contact and/or the second active region.

6. The semiconductor device of claim 3, further comprising a third spacer between the first bit line and the buried contact, the third spacer extending along a side surface of the buried contact.

7. The semiconductor device of claim 1, wherein the first spacer further extends along at least a portion of a side surface of the second bit line.

8. A semiconductor device comprising:
   a substrate;
   a bit line on the substrate, the bit line extending in a first direction;
   a word line in the substrate, the word line extending in a second direction intersecting the first direction, and the word line comprising a conductive layer having an upwardly facing surface;
   a cap of insulating material capping the conductive layer, the cap extending in the second direction, the cap having a lower surface contacting the upwardly facing surface of the conductive layer and an upper surface, and wherein a first portion of a trench extends into the cap from the upper surface thereof and terminates within the cap such that a bottom of the first portion of the trench is situated above the lower surface of the cap;

a silicon oxide film lining the first portion of the trench, the silicon oxide film constituting a first spacer; and a second spacer on the first spacer, the second spacer disposed in a region of the first portion of the trench left unfilled by the first spacer.

9. The semiconductor device of claim 8, wherein the substrate has an active region, and the active region has a second portion of the trench therein.

10. The semiconductor device of claim 9, wherein the first spacer lines parts of the first and second portions of the trench.

* * * * *